US009183000B2

(12) United States Patent
Ichida et al.

(10) Patent No.: US 9,183,000 B2
(45) Date of Patent: Nov. 10, 2015

(54) MEMORY SYSTEM

(75) Inventors: Makoto Ichida, Yokohama (JP); Hiroshi Sukegawa, Tokyo (JP); Naohiro Matsukawa, Yokohama (JP)

(73) Assignee: KABUSHIKI KAISHA TOSHIBA, Tokyo (JP)

(*) Notice: Subject to any disclaimer, the term of this patent is extended or adjusted under 35 U.S.C. 154(b) by 110 days.

(21) Appl. No.: 13/597,360

(22) Filed: Aug. 29, 2012

(65) Prior Publication Data

US 2013/0227268 A1 Aug. 29, 2013

(30) Foreign Application Priority Data

Aug. 30, 2011 (JP) ................................ 2011-187862

(51) Int. Cl.

| | |
|---|---|
| ***G06F 11/30*** | (2006.01) |
| ***G06F 1/20*** | (2006.01) |
| ***G11C 7/04*** | (2006.01) |
| ***G11C 16/06*** | (2006.01) |
| ***G06F 9/44*** | (2006.01) |
| *H01L 21/324* | (2006.01) |
| *H01L 23/38* | (2006.01) |
| *G06F 3/06* | (2006.01) |
| *H01L 23/34* | (2006.01) |

(52) U.S. Cl.

CPC .......... *G06F 9/4421* (2013.01); *G06F 11/3034* (2013.01); *G06F 11/3058* (2013.01); *G11C 7/04* (2013.01); *G11C 16/06* (2013.01); *G06F 1/20* (2013.01); *G06F 1/206* (2013.01); *G06F 3/0679* (2013.01); *H01L 21/324* (2013.01); *H01L 23/34* (2013.01); *H01L 23/38* (2013.01)

(58) Field of Classification Search

CPC ..... G06F 1/20; G06F 11/002; G06F 11/3058; G06F 12/0246; H01L 21/324; H01L 23/34; H01L 23/38

USPC .......................................... 711/103; 327/512

See application file for complete search history.

(56) References Cited

U.S. PATENT DOCUMENTS 5,867,990 A * 2/1999 Ghoshal .......................... 62/3.7
6,009,033 A * 12/1999 Li et al. ......................... 365/212

(Continued)

FOREIGN PATENT DOCUMENTS

JP 2009-37670 2/2009

OTHER PUBLICATIONS

N. Matsukawa, et al., "Distributed-cycling Effects for Data Retention Characteristics of Flash Memories", Extended Abstracts of the 2008 International Conference on Solid State Devices and Materials, Tsukuba, 2008, pp. 236-237.

(Continued)

*Primary Examiner* — Charles Rones
*Assistant Examiner* — Andrew Russell
(74) *Attorney, Agent, or Firm* — Oblon, McClelland, Maier & Neustadt, L.L.P.

(57) ABSTRACT

According to one embodiment, a memory system includes a nonvolatile semiconductor storage able to hold data, a temperature measurement section configured to measure the temperature of the semiconductor storage, a temperature varying section configured to change the temperature of the semiconductor storage, and a control circuit including a transmitter configured such that data received from a host is transferred to the semiconductor storage, and a temperature storage configured to store temperature information received from the temperature measurement section.

14 Claims, 38 Drawing Sheets

(56) References Cited

U.S. PATENT DOCUMENTS

| | | | | |
|---|---|---|---|---|
| 6,559,538 | B1 * | 5/2003 | Pomerene et al. | 257/712 |
| 2003/0057511 | A1 * | 3/2003 | Inbe | 257/467 |
| 2005/0150691 | A1 * | 7/2005 | Schultz et al. | 175/57 |
| 2007/0215869 | A1 * | 9/2007 | Moriya et al. | 257/40 |
| 2008/0157141 | A1 * | 7/2008 | Han | 257/292 |
| 2010/0023678 | A1 * | 1/2010 | Nakanishi et al. | 711/103 |
| 2011/0110158 | A1 * | 5/2011 | Schuette | 365/185.17 |
| 2011/0248280 | A1 * | 10/2011 | Bettencourt et al. | 257/76 |

OTHER PUBLICATIONS

Reza Moazzami, et al., "Stress-Induced Current in Thin Silicon Dioxide Films", IEDM, 1992, pp. 139-142.

G. Ghidini, et al., "Stress Induced Leakage Current and Bulk Oxide Trapping: Temperature Evolution", IEEE 02CH37320, $40^{th}$ Annual Internationl Reliability Physics Symposium, 2002, pp. 415-416.

N. Mielke, H Belgal, I. Kalastirsky, P. Kalavade, A. Kurtz, Qingru Meng, N. Righos, Jie Wu, "Flash EEPROM Threshold Instabilities due to Charge Trapping During Program Erase cycling," *IEEE Transactions on Device and Materials Reliability*, vol. 4, Issue 3, 2004, pp. 335-344.

N. Mielke, H. Belgal, A. Fazio, Q. Meng, and N. Righos, "Recovery effects in the distributed cycling of Flash memories," In *Proc. IRPS*, pp. 29-35, 2006.

H. P. Belgal, N. Righos, I. Kalastirsky, J. J. Peterson, R. Shiner, N. Mielke, "A new reliability model for post-cycling charge retention of flash memories," in *Proc. IRPS*, pp. 7-20, 2002.

J.-D. Lee, J.-H. Choi, D. Park, and K Kim, "Degradation of tunnel oxide by FN current stress and its effects on data retention characteristics of 90 nm NAND Flash memory cells," in *Proc. IRPS*, pp. 497-501, 2003.

J.-D. Lee, J.-H. Choi, D. Park, and K. Kim, "Effects of interface trap generation and annihilation on the data retention characteristics of Flash memory cells," IEEE Trans. Device Mater. Rel., vol. 4, pp. 110-117, Mar. 2004.

R. Yamada, Y. Mori, Y. Okuyama, J. Yugaml, T. Nishimoto, and H. Kume, "Analysis of detrap current due to oxide traps to improve flash memory retention," in Proc. IRPS, pp. 200-204, 2000.

C. miccoli, C. Monzio Compagrioni, S. Beltrami, A. S. Spinelli, and A. Visconti, "Threshold-voltage instability due to damage recovery in nanoscale NAND Flash memories," IEEE Trans. Electron Devices, vol. 58, pp. 2406-2414, Aug. 2011.

* cited by examiner

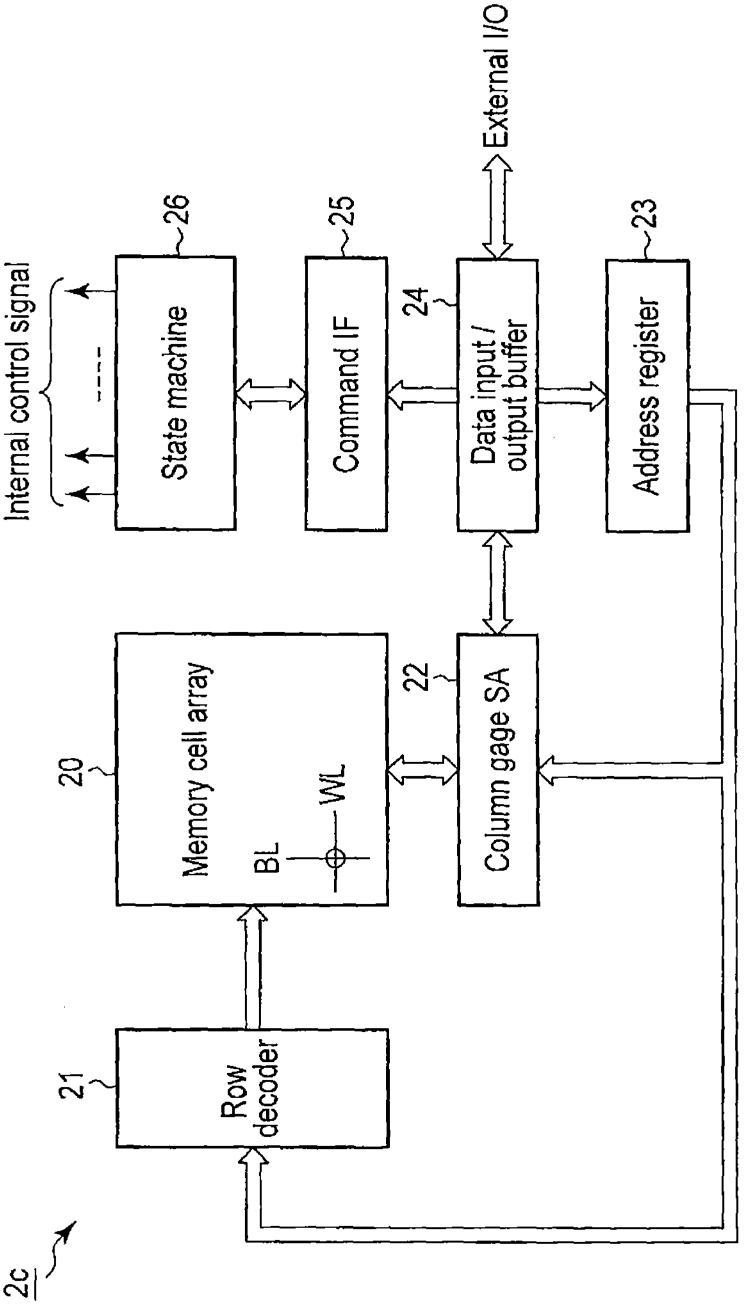
F I G. 4

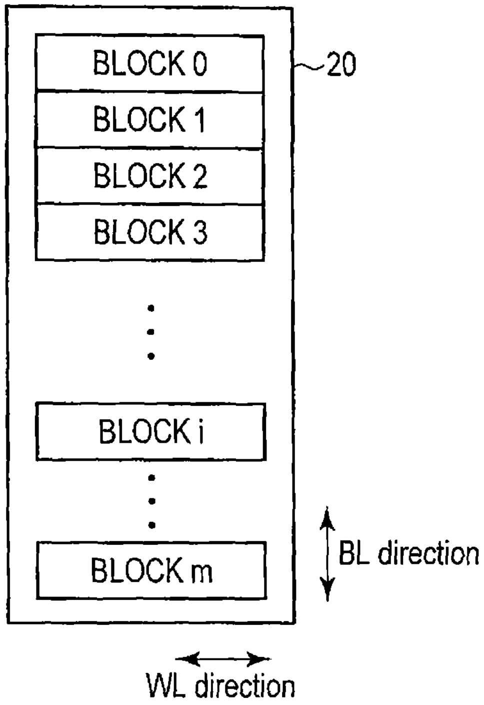
F I G. 5

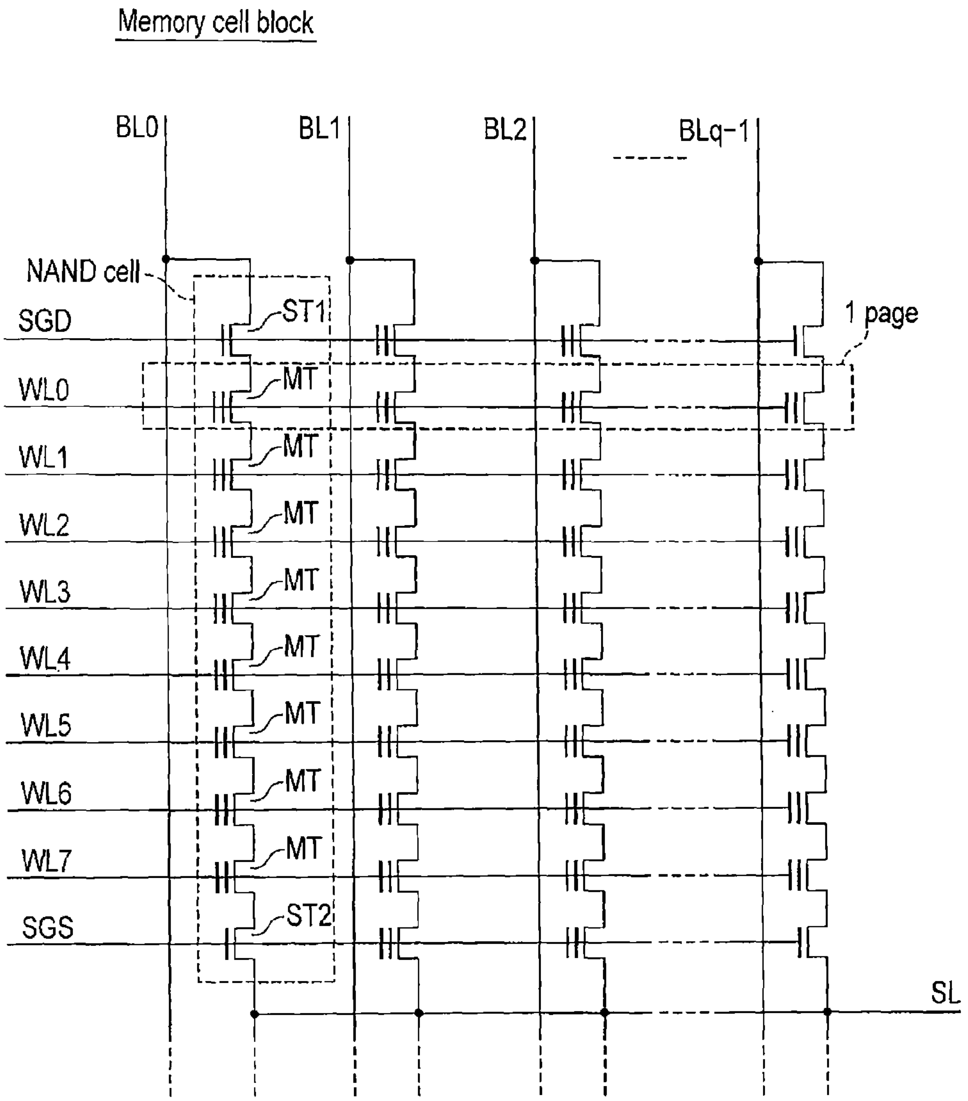
F I G. 6

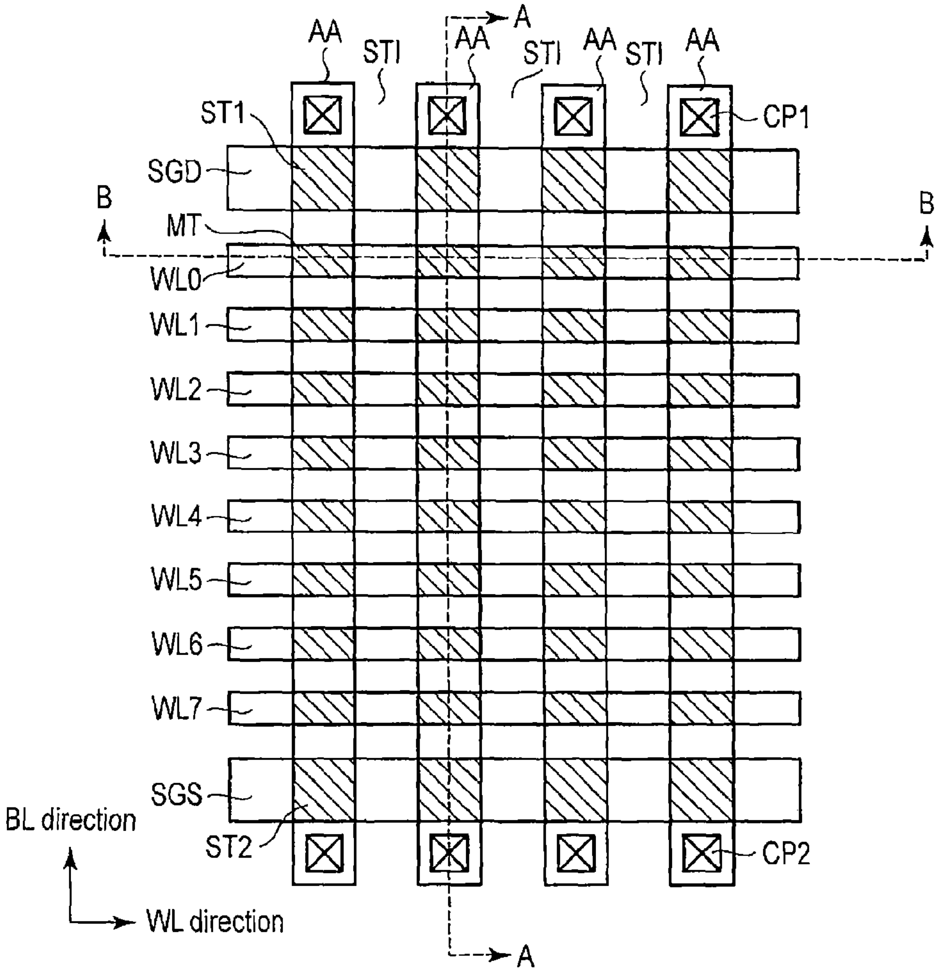
F I G. 7

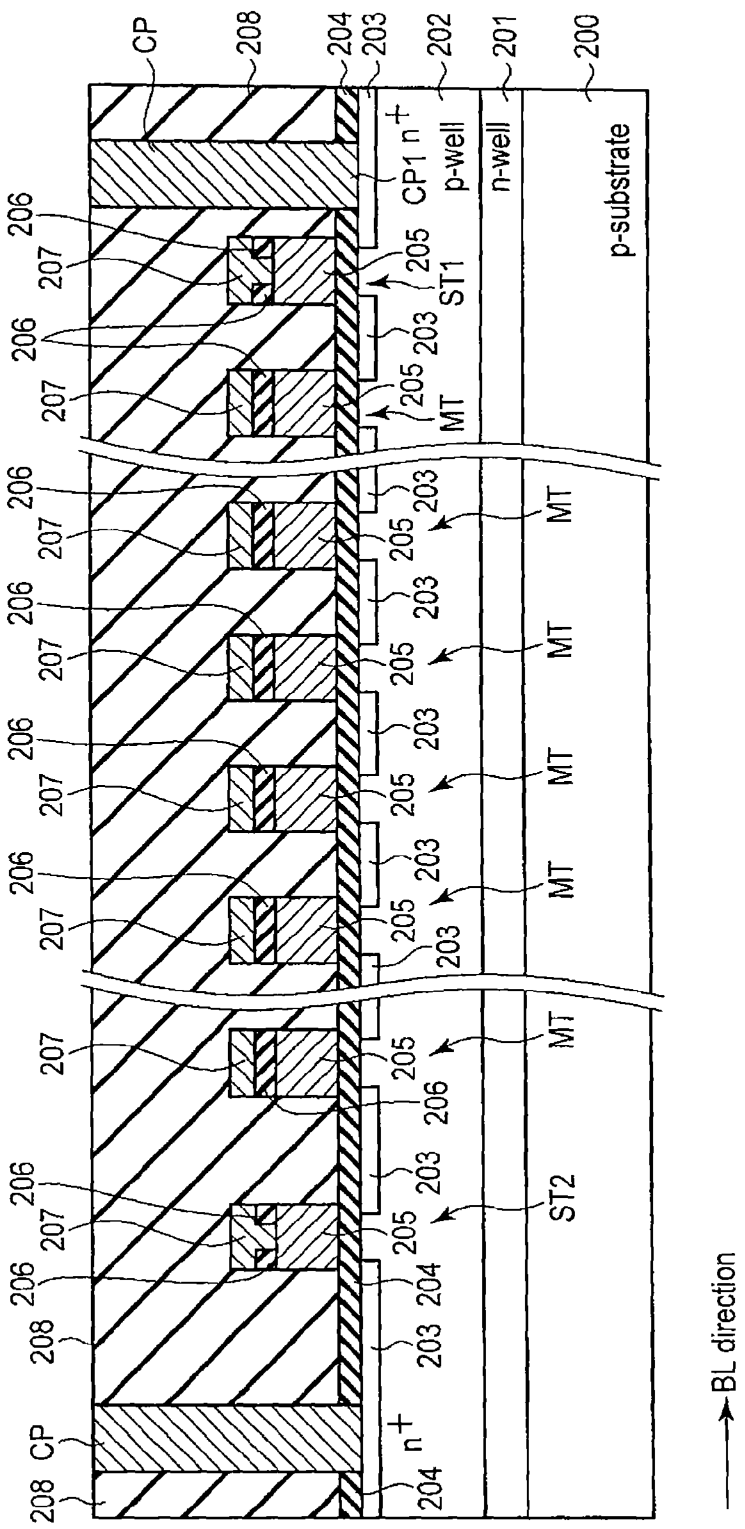
F I G. 8

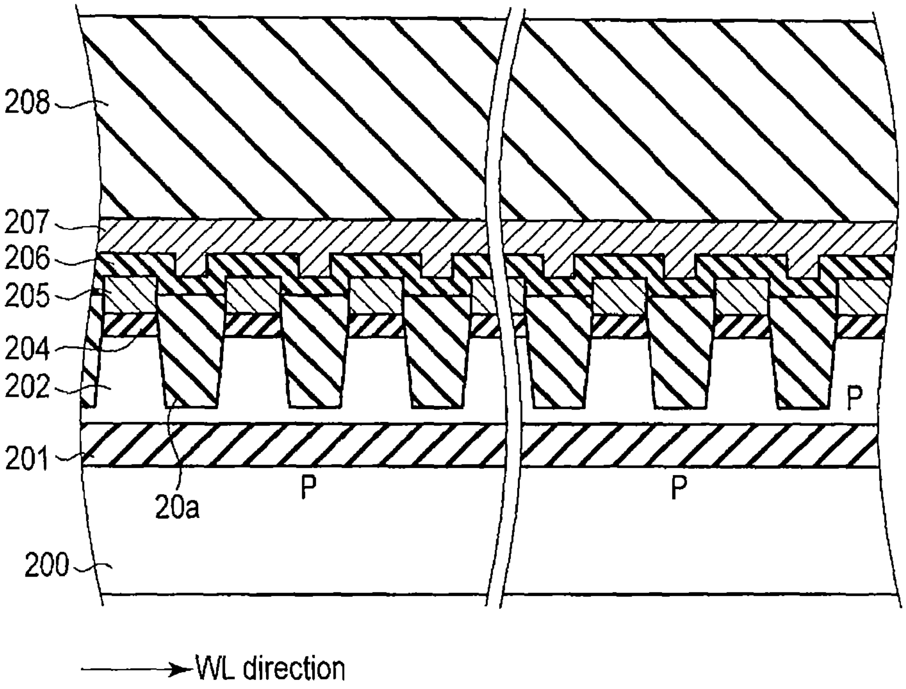
F I G. 9

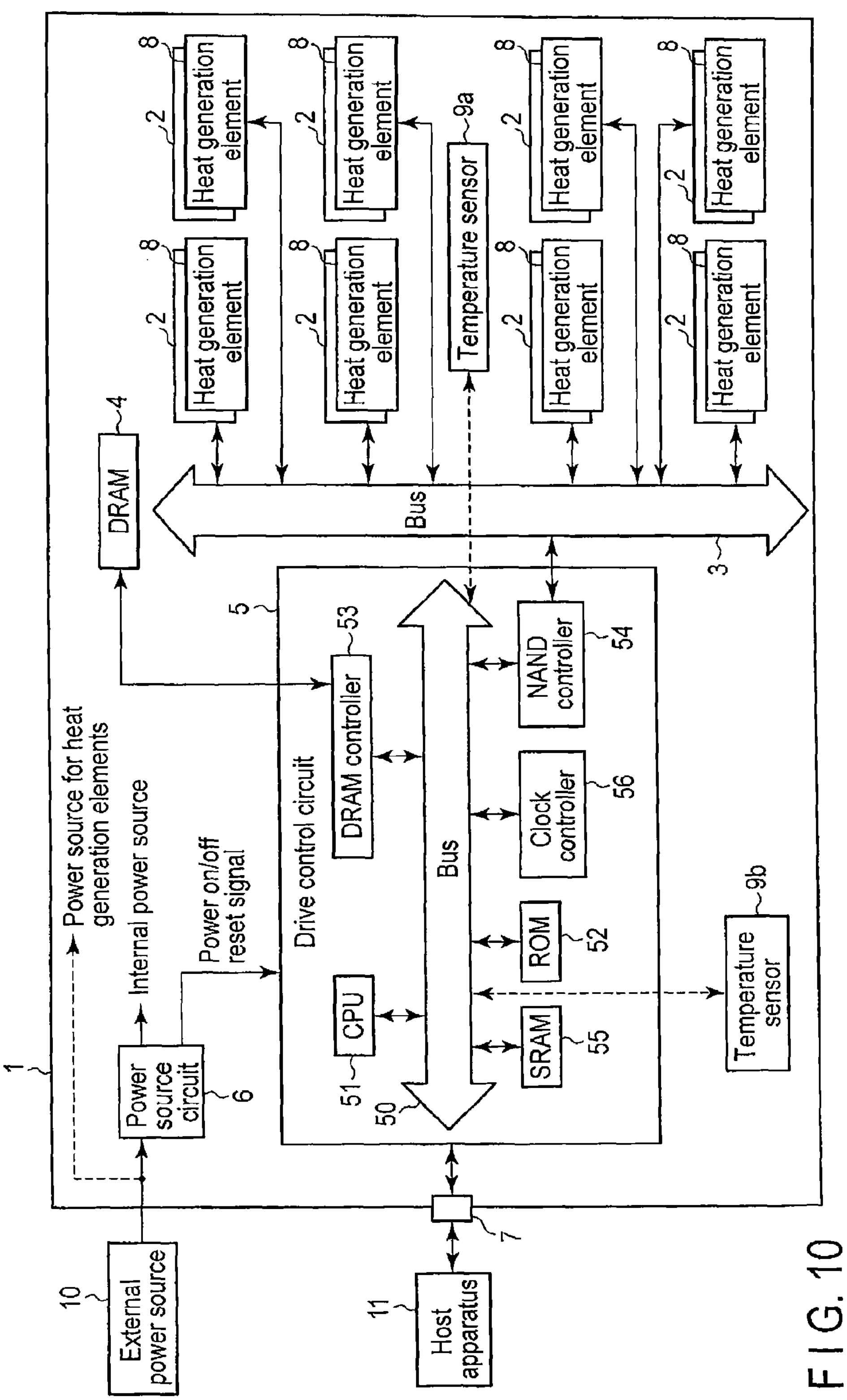
F I G. 10

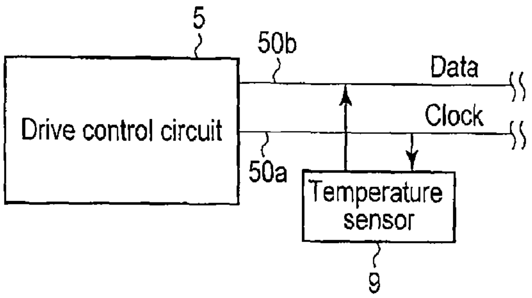
F I G. 11
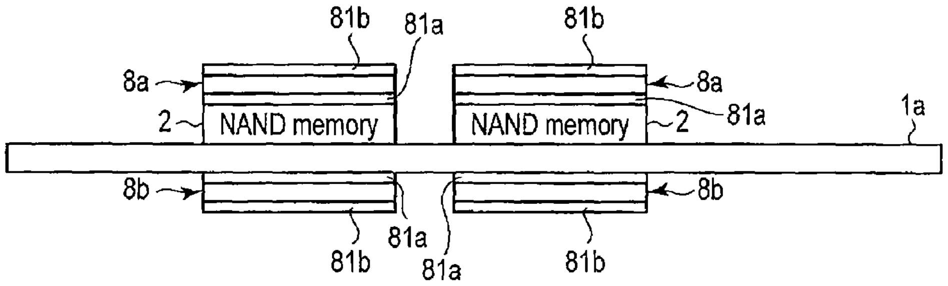
F I G. 12

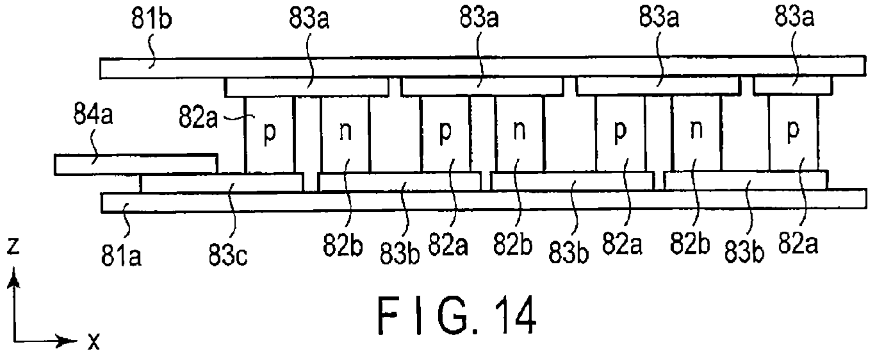
F I G. 14
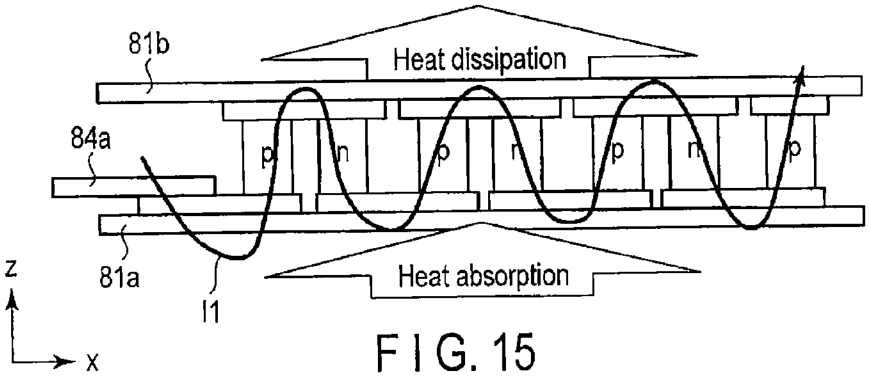
F I G. 15
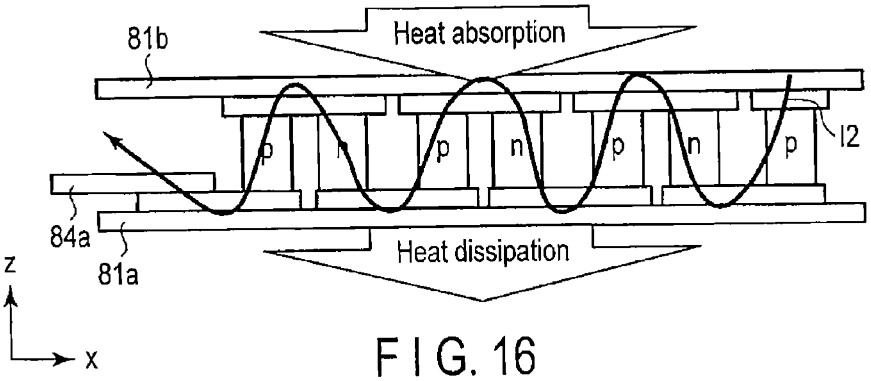
F I G. 16

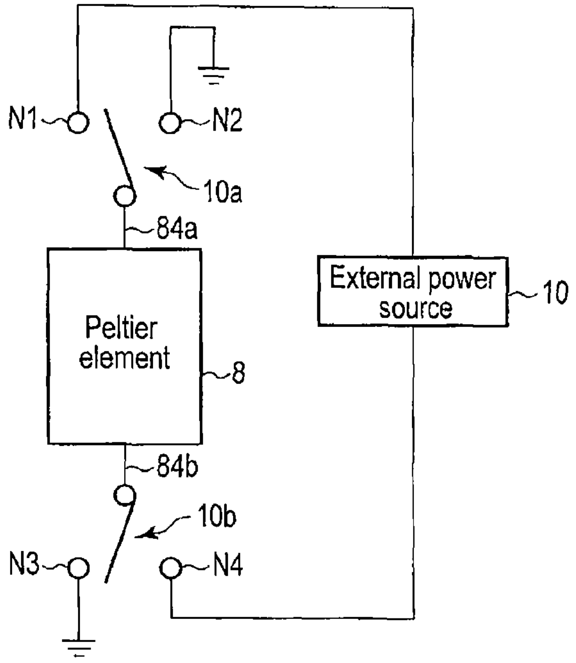
F I G. 17
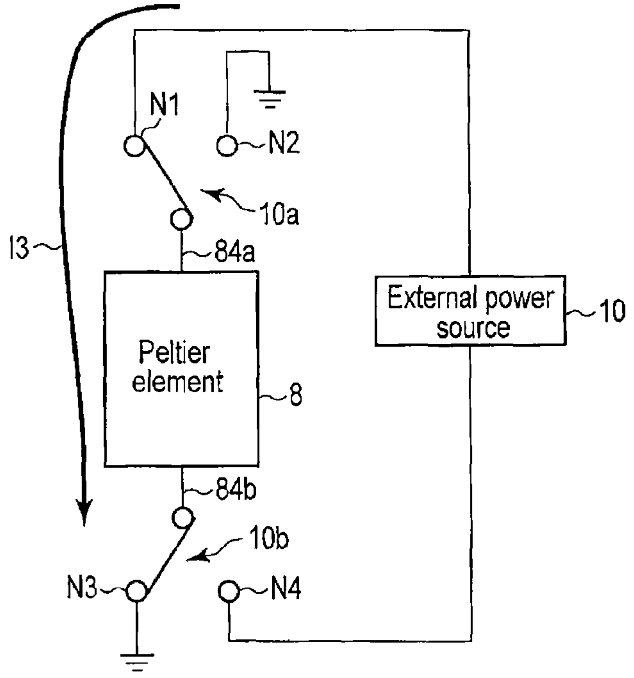
F I G. 18

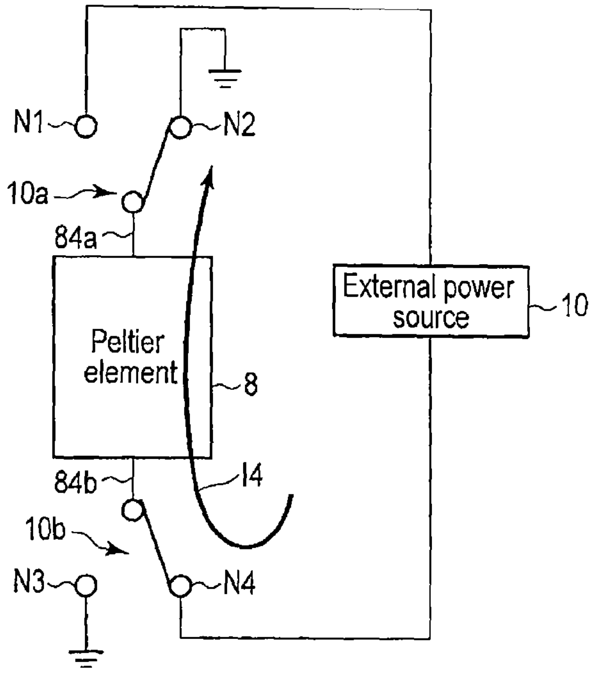
F I G. 19
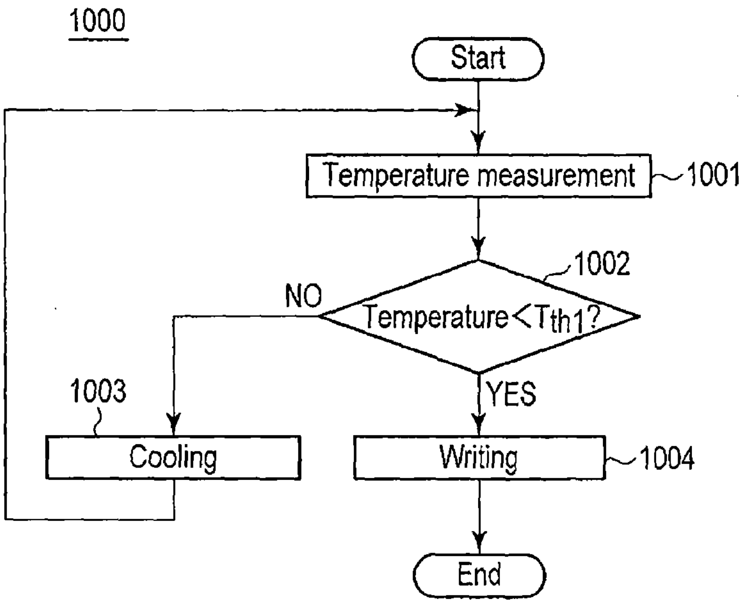
F I G. 20

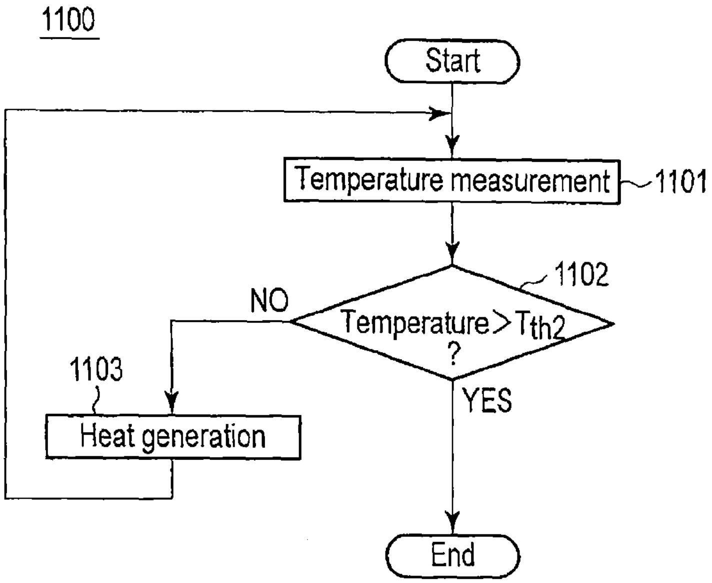
F I G. 21
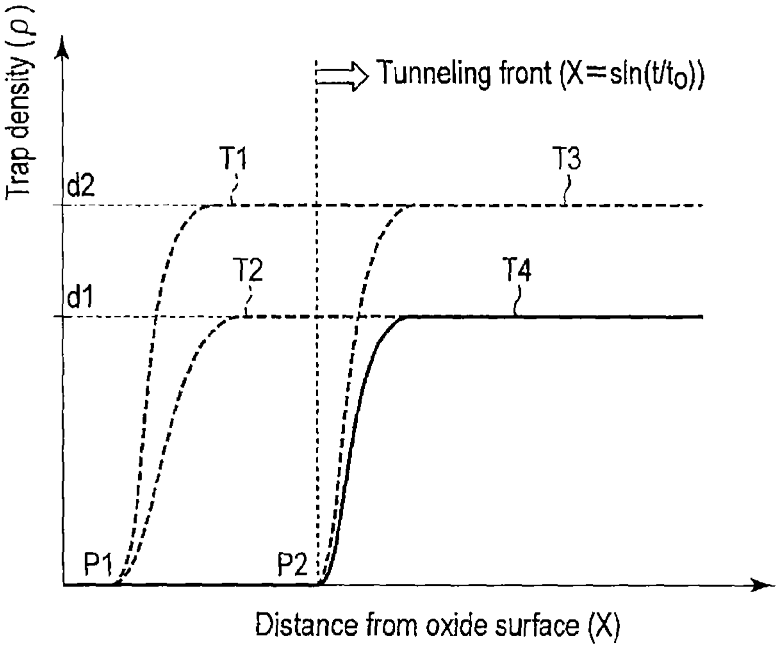
F I G. 22

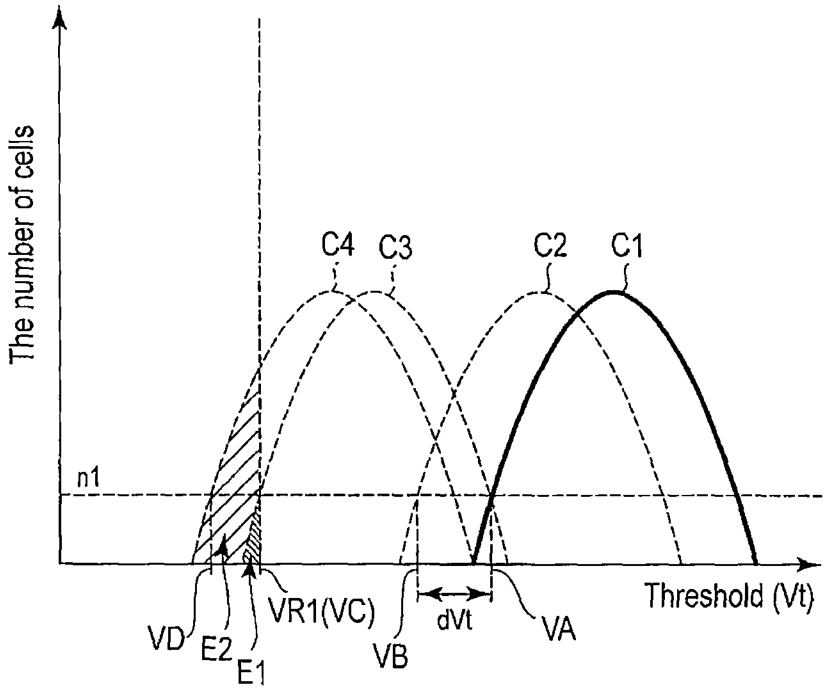
F I G. 23

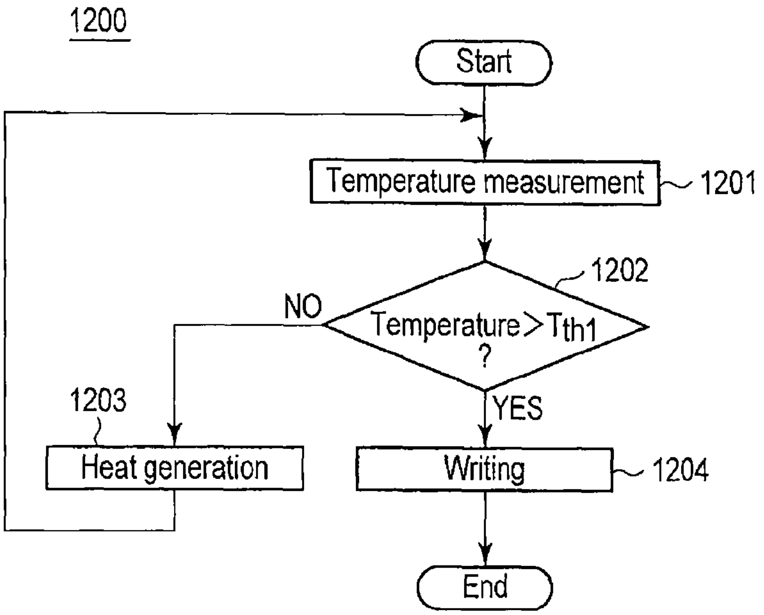
F I G. 25
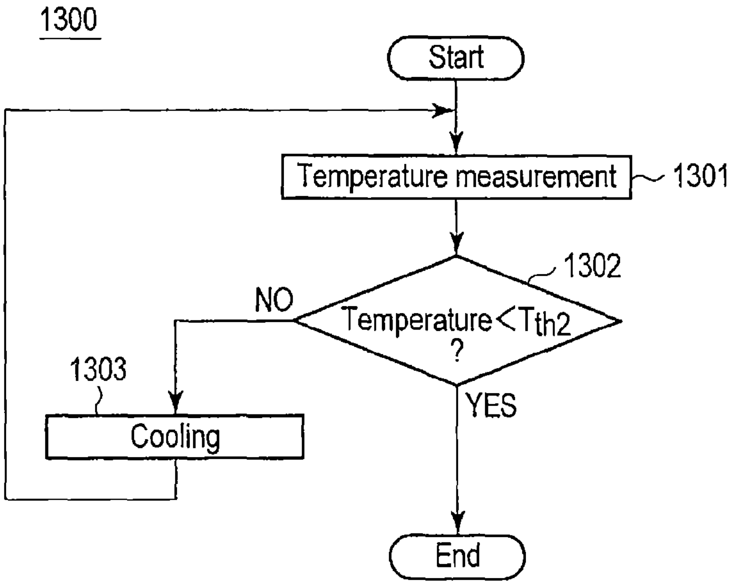
F I G. 26

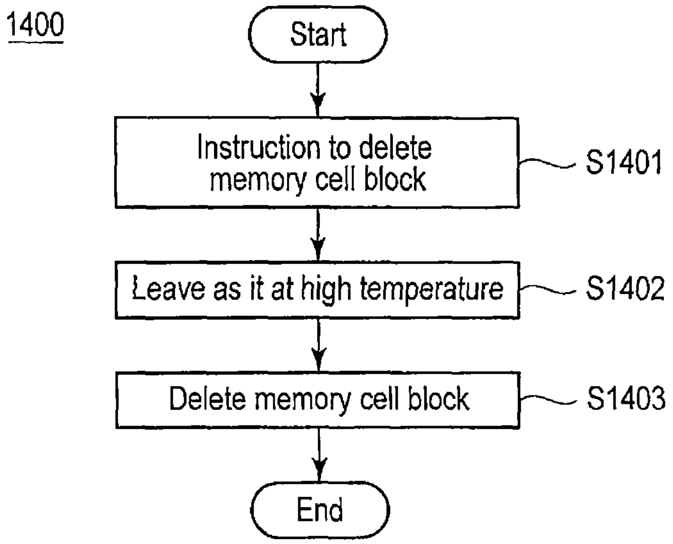
F I G. 27

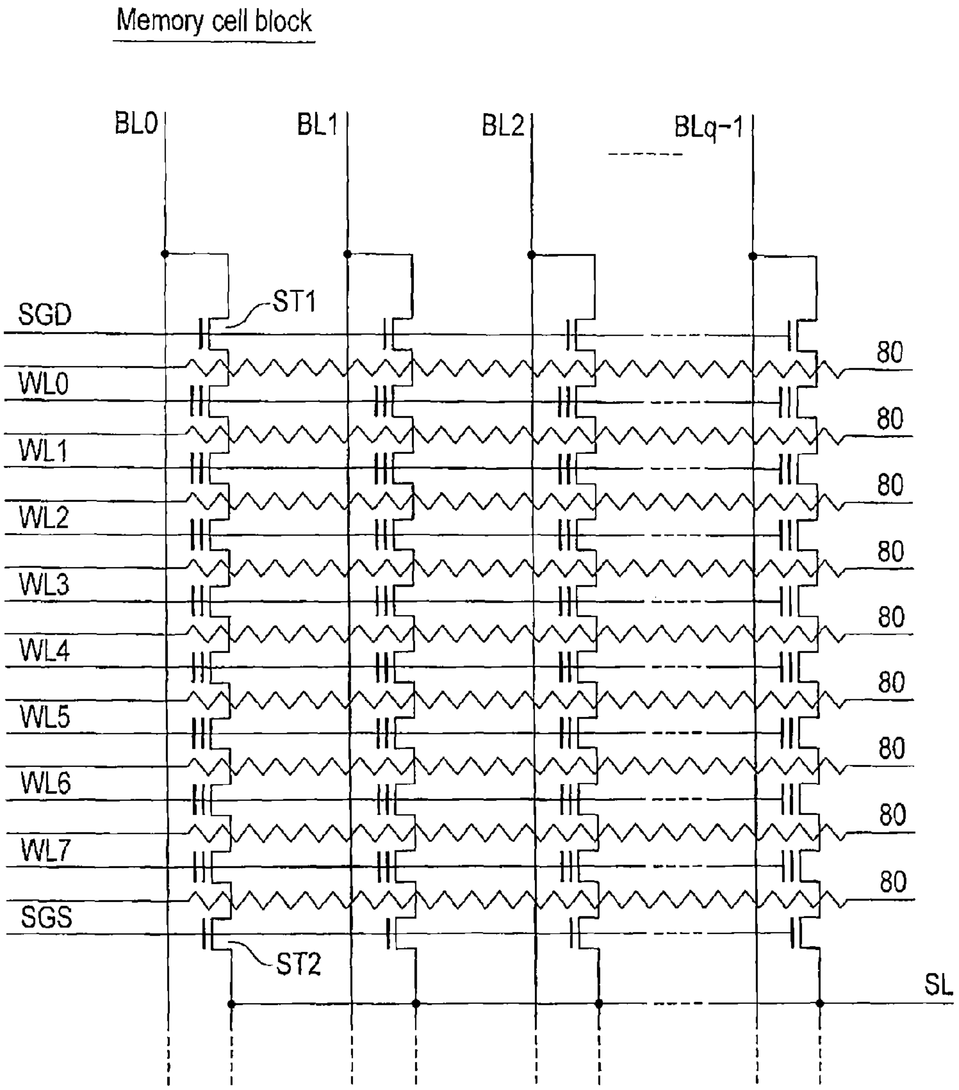
F I G. 28

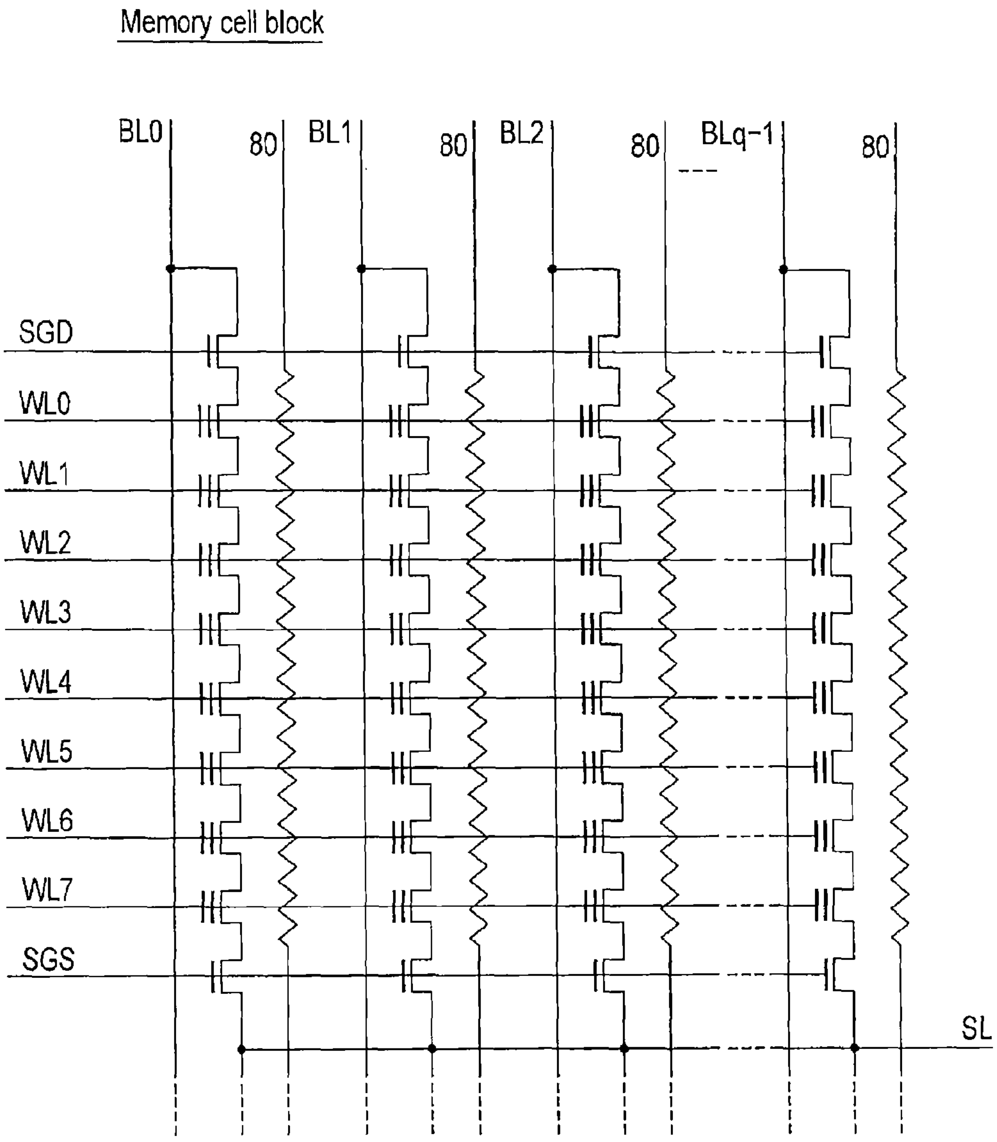
F I G. 30

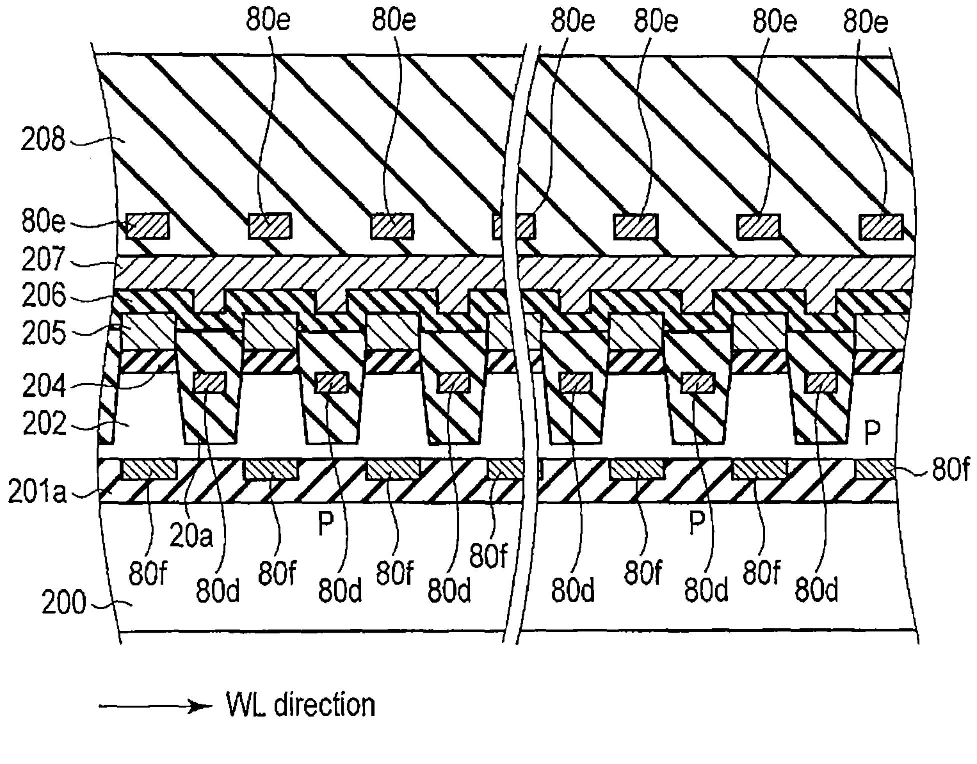
F I G. 31

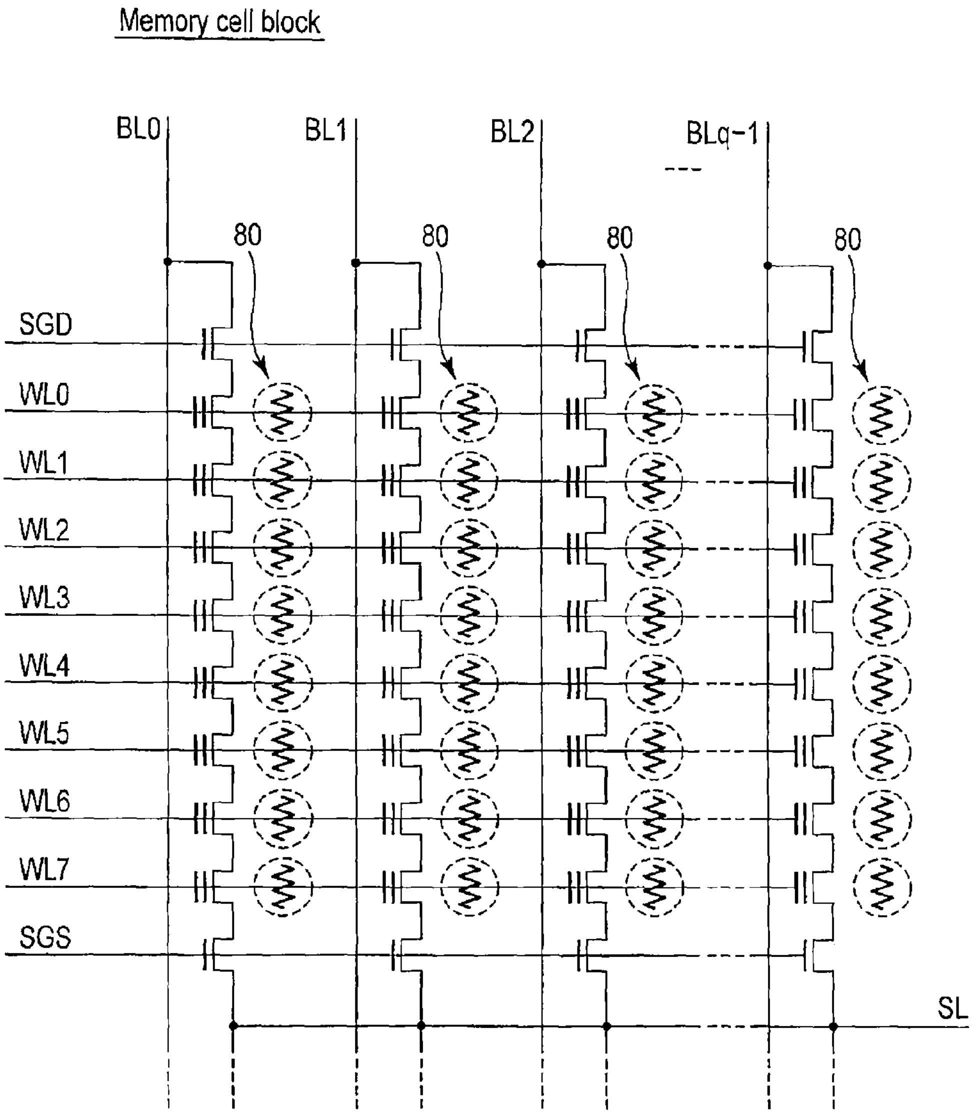
F I G. 32

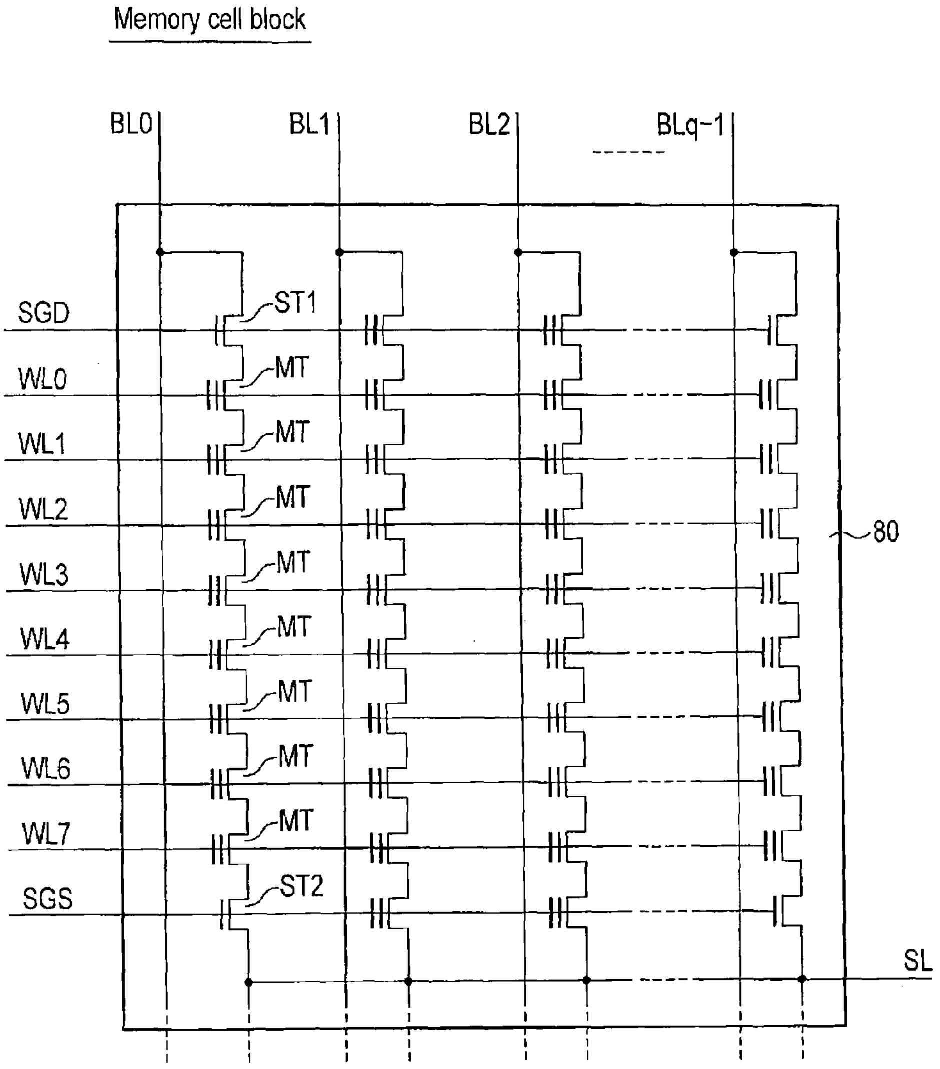
F I G. 33

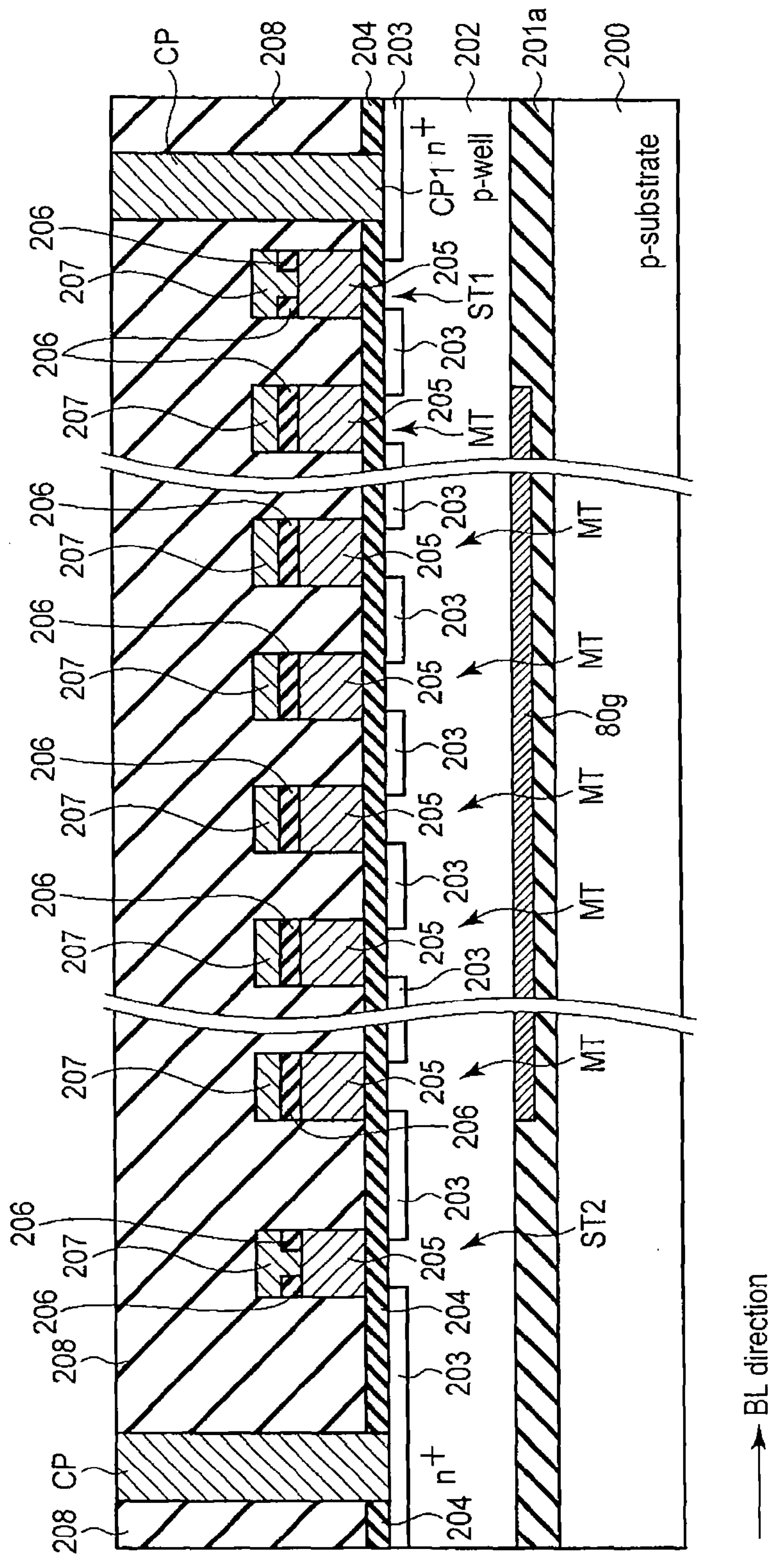
F I G. 34

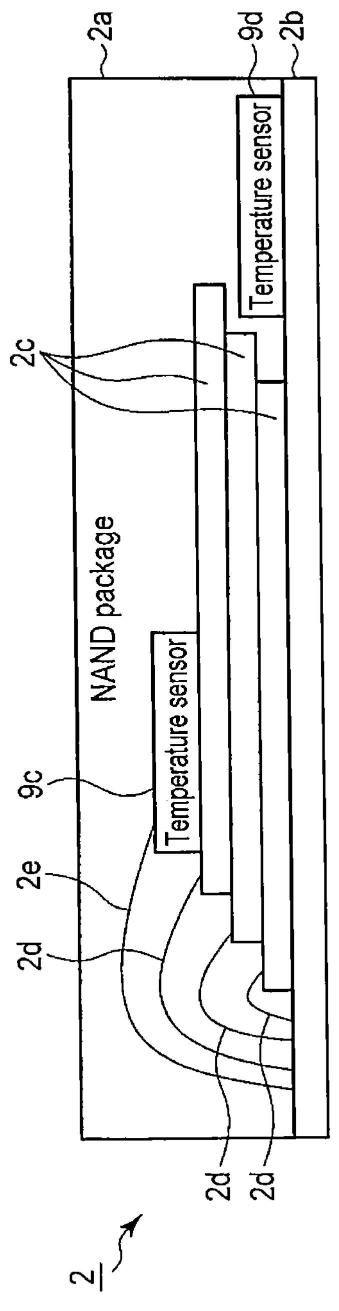
F I G. 35

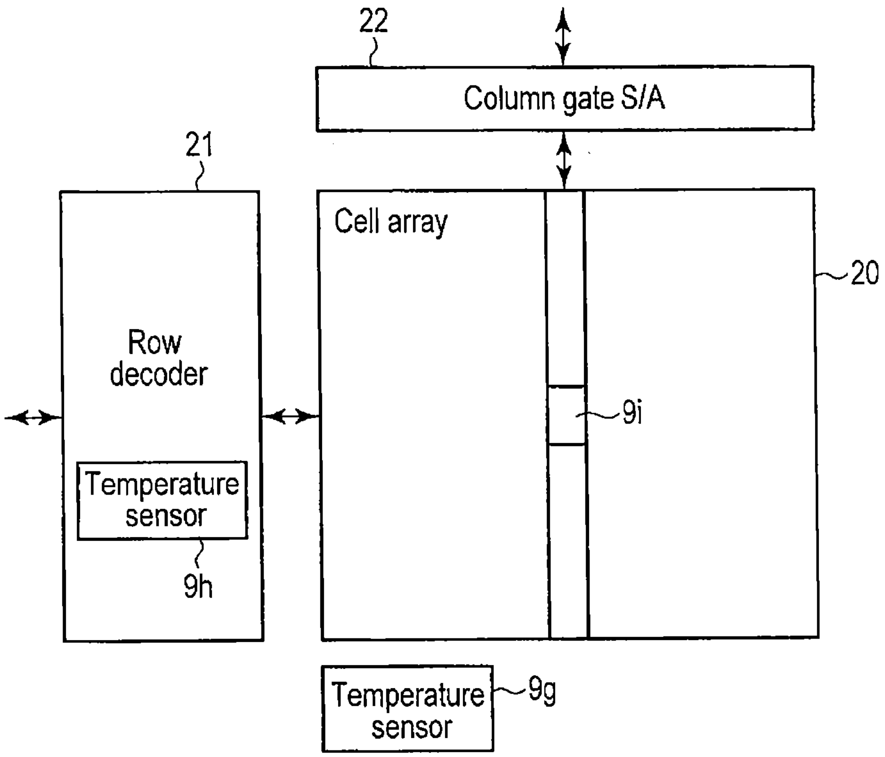
F I G. 37

Temperature table (for each chip)

| Chip No | Temperature (°C) |
|---|---|
| 0 | 90 |
| 1 | 85 |
| 2 | 60 |
| 3 | 20 |
| ... | ... |

F I G. 39

Temperature table (for each package)

| Package No | Temperature (°C) |
|---|---|
| 0 | 30 |
| 1 | 60 |
| 2 | 40 |
| 3 | 90 |
| ... | ... |

F I G. 40

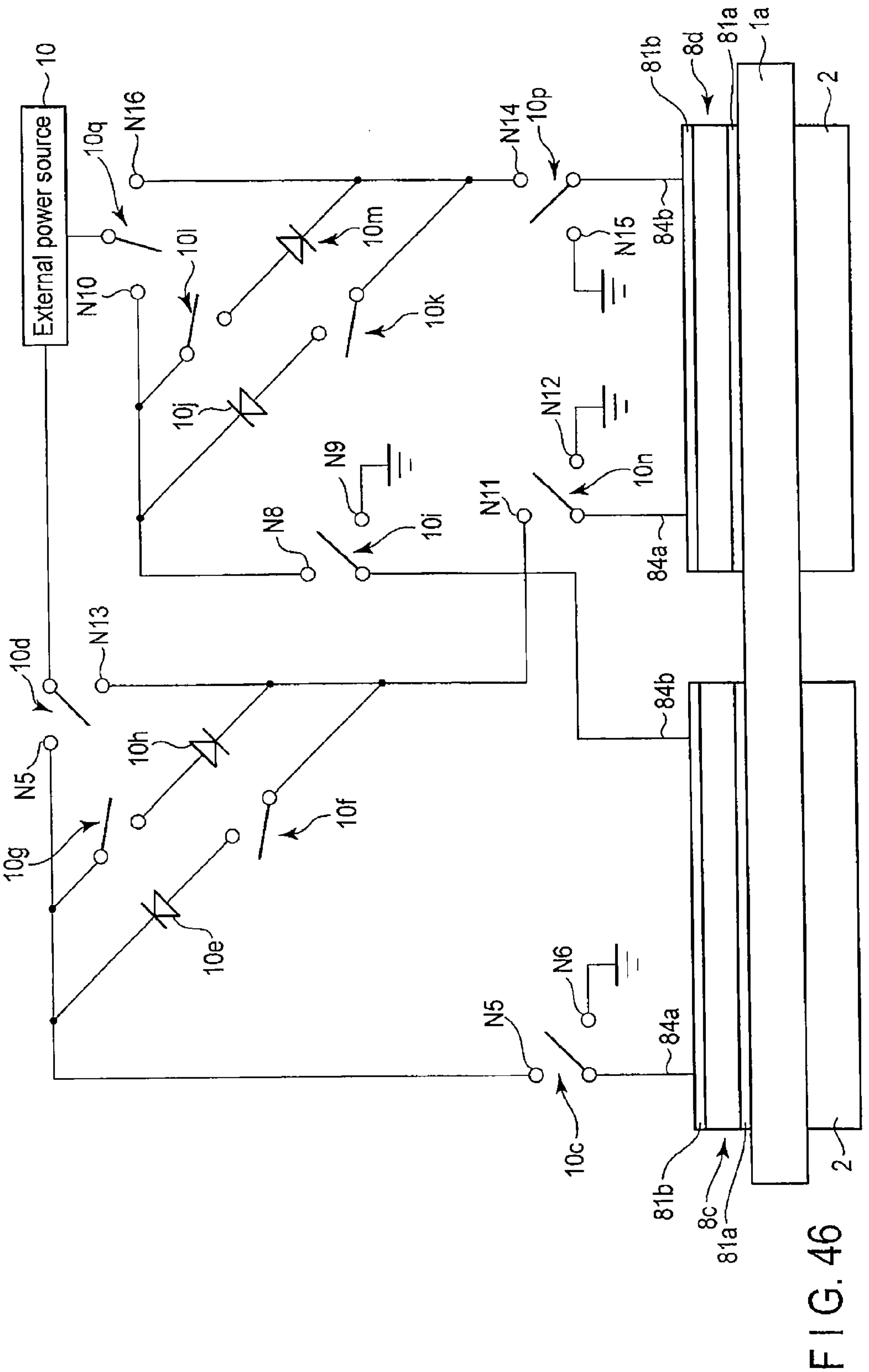
F I G. 46

MEMORY SYSTEM

CROSS-REFERENCE TO RELATED APPLICATIONS

This application is based upon and claims the benefit of priority from Japanese Patent Application No. 2011-187862, filed Aug. 30, 2011, the entire contents of which are incorporated herein by reference.

FIELD

Embodiments described herein relate generally to a memory system.

BACKGROUND

In a flash memory, by passing charges through a tunnel insulating film, charges are injected from a semiconductor substrate into a charge accumulating layer or charges are held near the boundary between the charge accumulating film and tunnel insulating film.

However, moving charges in a tunnel insulating film lead to the problem that the tunnel insulating film may deteriorate (i.e., charges trapped in the insulating film increase), resulting in degradation of data holding characteristics. As described above, conventionally, it has been difficult to achieve a nonvolatile semiconductor device that has a high quality memory cell.

BRIEF DESCRIPTION OF THE DRAWINGS

FIG. 4 is a schematic block diagram of the basic configuration of a NAND chip according to the embodiments;

FIG. 5 is a schematic block diagram of the basic configuration of a memory cell array according to the embodiments;

FIG. 6 shows a schematic circuit diagram of the basic configuration of a memory cell block according to the embodiments;

FIG. 7 is a schematic top view of the basic configuration of a memory cell block according to the embodiments;

FIG. 8 is a cross-sectional view taken along the line A-A of FIG. 7;

FIG. 9 is a cross-sectional view taken along the line B-B of FIG. 7;

FIG. 10 is a schematic block diagram of the basic configuration of a memory system according to the first embodiment;

FIG. 11 is a diagram schematically illustrating the connection of the temperature sensor relative to the drive control circuit, according to the first embodiment;

FIG. 12 is a schematic cross-sectional view illustrating the arrangement of NAND memories relative to Peltier elements according to the first embodiment;

FIG. 14 is a schematic cross-sectional view of the basic configuration of each Peltier element according to the first embodiment;

FIG. 15 is a cross-sectional view schematically illustrating the basic operation of a Peltier element, according to the first embodiment;

FIG. 16 is a cross-sectional view schematically illustrating the basic operation of a Peltier element, according to the first embodiment;

FIG. 17 is a circuit diagram schematically illustrating the arrangement of a Peltier element relative to an external power source, according to the first embodiment;

FIG. 18 is a circuit diagram schematically illustrating current flow in a Peltier element, according to the first embodiment;

FIG. 19 is another circuit diagram schematically illustrating current flow in a Peltier element, according to the first embodiment;

FIG. 20 is a flowchart schematically illustrating the operation of writing data in NAND memories of the memory system according to the first embodiment;

FIG. 21 is a flowchart schematically illustrating the operation in which writing or deleting in the NAND memories of the memory system according to the first embodiment is not performed;

FIG. 22 is a graph illustrating the relation between the density of electrons trapped in the tunnel insulating film of each of the memory cell transistors and the distance between the tunnel insulating film and the semiconductor substrate;

FIG. 23 is a graph illustrating the relation between the threshold of the charge accumulating layer of each of the memory cell transistors and the number of cells;

FIG. 25 is a flowchart schematically illustrating the operation of writing data in NAND memories of a memory system according to the second embodiment;

FIG. 26 is a flowchart schematically illustrating an operation where writing or deleting in the NAND memories of the memory system according to the second embodiment is not performed;

FIG. 27 is flowchart schematically explaining a memory block deleting method for the memory system according to the third embodiment;

FIG. 28 is a schematic circuit diagram of the basic structure of a memory cell block according to the fourth embodiment;

FIG. 30 is a schematic circuit diagram schematically of the basic structure of a memory cell block according to the fourth embodiment;

FIG. 31 is a cross-sectional view taken along each word line of FIG. 30;

FIG. 32 is a schematic circuit diagram of the basic structure of a memory cell block according to the fourth embodiment;

FIG. 33 is a schematic circuit diagram of the basic structure of a memory cell block according to the fourth embodiment;

FIG. 34 is a cross-sectional view taken along each bit line of FIG. 33;

FIG. 35 is a schematic cross-sectional view of a basic configuration of a NAND memory according to the sixth embodiment;

FIG. 37 is a schematic block diagram of the basic configuration of a NAND chip according to the sixth embodiment;

FIG. 39 is a temperature table for holding the temperature information of each NAND chip (for each chip);

FIG. 40 is a temperature table (for each package) used to hold the temperature information of each NAND package;

FIG. 46 illustrates another example of the circuit in a case where two adjacent Peltier elements are electrically connected to each other.

DETAILED DESCRIPTION

Figure 1:
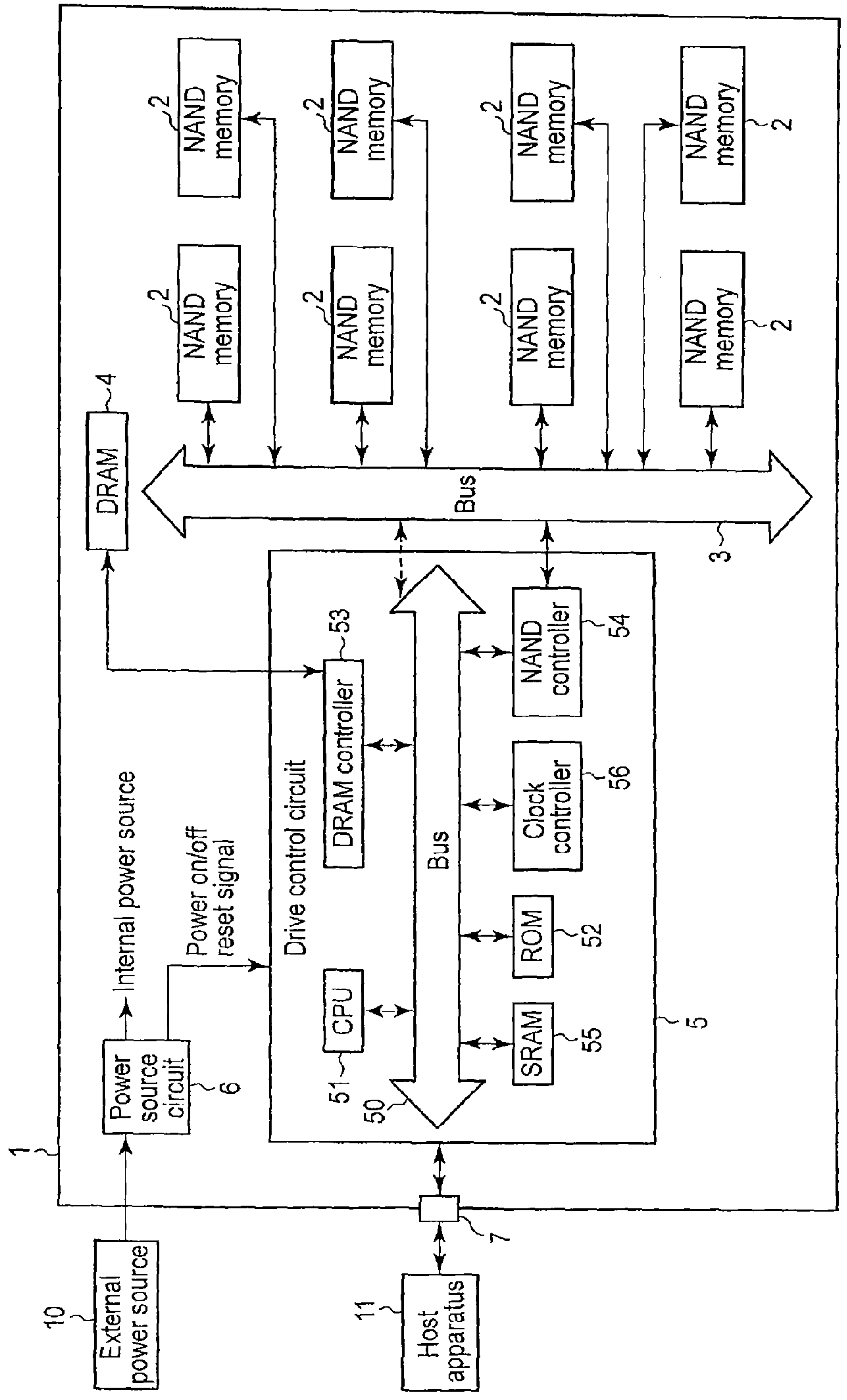
FIG. 1 is a schematic block diagram of the basic configuration of an SSD (memory system) according to the embodiments.

In general, according to one embodiment, a memory system includes: a nonvolatile semiconductor storage able to hold data; a temperature measurement section configured to measure the temperature of the semiconductor storage; a temperature varying section configured to change the temperature of the semiconductor storage; and a control circuit including a transmitter configured such that data received from a host is transferred to the semiconductor storage, a temperature storage configured to store temperature information received from the temperature measurement section, and a temperature controller configured to control the temperature varying section based on the temperature information stored in the temperature storage.

Referring to the drawings, embodiments will be described in detail below. In the description, common parts are labeled with corresponding common reference symbols in all the drawings. An alphabetical symbol following a number composes a reference symbol used to distinguish elements that have the same configuration. If it is not necessary to distinguish the elements, these elements are referred to by a reference symbol consisting only of a number. For example, if elements labeled with reference symbols 1*a* and 1*b* do not have to be distinguished from one another, these elements are comprehensively referred to by reference symbol 1.

A memory system according to each of the embodiments below will be explained using a Solid State Device (hereinafter referred to as an SSD). However, it is to be understood that each embodiment is not limited to the SSD.

In order to facilitate understanding of the embodiments below, the basic configuration of the SSD will be described first.

<Configuration of SSD>

The basic configuration of an SSD 1 that is common to the embodiments will be described schematically.

FIG. 1 is a schematic block diagram of the basic configuration of an SSD (memory system) 1 according to each embodiment.

As shown in FIG. 1, the SSD 1 includes: NAND (NOT AND) flash memory packages (also simply called NAND memories, NAND packages, or the like) 2 that have a plurality of NAND type flash memories for storing data; a DRAM (Dynamic Random Access Memory) 4 for data transfer or task areas; a drive control circuit 5 for controlling these; and a power source circuit 6 to which power is supplied from an external power source 10.

The SSD 1 carries out data transmission or reception between itself and a host apparatus (host) 11, such as a personal computer, via an ATA interface (Advanced Technology Attachment Interface: ATA I/F) 7 or SATA interface (Serial Advanced Technology Attachment Interface: SATA I/F) (not shown). As an interface for the SSD 1 for connection with the host apparatus 11, etc., not only ATA/SATA but also PCE-E (Peripheral Component Interconnected Express: PCI Express) can be used.

The power source circuit 6 generates a plurality of internal power sources using power supplied by the external power source 10. These internal power sources are supplied to each part, for example, NAND memories 2, of the SSD 1. The power source circuit 6 detects rising or falling in the external power source 10, and generates a power-on reset signal or power-off reset signal. These power-on and power-off reset signals are transmitted to the drive control circuit 5.

The drive control circuit 5 includes a first bus 50, a CPU 51, ROM (read only memory) 52, DRAM (dynamic random access memory) controller 53, NAND controller 54, and SRAM (static random access memory) 55.

Connected to the first bus 50 is the CPU 51 that controls the overall drive control circuit 5. Also connected to the first bus 50 is a ROM 52 storing a boot program for each management program (FW: firmware). Also connected to the first bus 50 are the DRAM controller 53, which controls a DRAM 4, the NAND controller 54, which controls the NAND memories 2, and the SRAM 55, which is used as a data task area. Furthermore, connected to the first bus 50 is a clock controller 56, which receives power on/off reset signals from the power source circuit 6 and supplies reset and clock signals to each part. This clock controller 56 is used, for example, to measure time in the memory system.

A second bus 3 connects NAND memories 2 and the drive control circuit 5. Incidentally, the NAND controller 54 and bus 3 may be connected or the first bus 50 and second bus 3 may be connected directly (refer to the broken-line arrows in FIG. 1).

NAND memories 2 are connected to the drive control circuit 5 via the second bus 3. NAND memories 2 have a plurality of memory chips (not shown), which are flash memories with identical circuit configuration. Here, as NAND memories 2, arbitrary memory chips can be used. To be specific, for example, any type of NAND type of flash memory chip can be used. In FIG. 1, eight NAND memories 2 are arranged, but the number of these is not limited to eight and can be changed, as necessity requires.

<Configuration of CPU>

Figure 2:
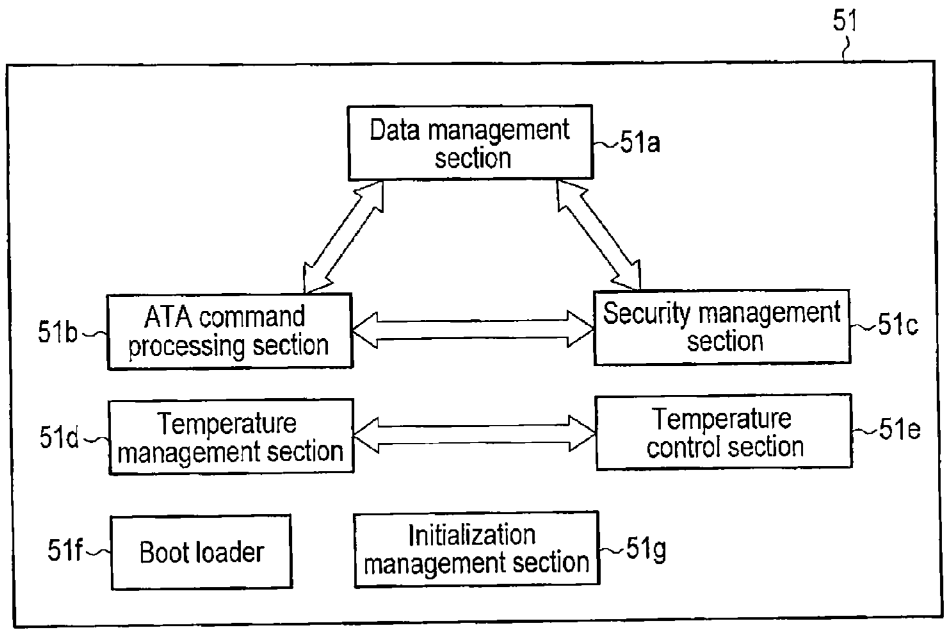
FIG. 2 is a schematic block diagram of the functional configuration of a CPU according to the embodiments.

Next, the functional configuration of the CPU 51 will be schematically described with reference to FIG. 2.

The CPU 51 includes, for example, a data management section 51*a*, an ATA command processing section 51*b*, a security management section 51*c*, a temperature management section 51*d*, a temperature controller 51*e*, a boot loader 51*f*, and an initialization management section 51*g*.

Via the NAND controller 54, the data management section 51*a* controls data transfer between NAND memories 2 and the DRAM 4, and various functions relating to the NAND memories 2.

The ATA command processing section 51*b* performs data transfer processes in cooperation with the data management section 51*a* via the DRAM controller 53. The security management section 51*c* manages a variety of security information in cooperation with the data management section 51*a* and ATA command processing section 51*b*.

The temperature management section 51*d* manages temperature information and so on about the NAND memories 2 measured by a temperature sensor (described below). This temperature information and so on can be rewritten if needed. When managing temperature information and so on about the NAND memories 2 or NAND chips, a dedicated table, for exempla, may be prepared, and the temperature information and so on may be stored so as to be correlated with the identification numbers of NAND memories 2 or NAND chips.

The temperature controller 51*e* controls a heat generation element, a temperature sensor, etc. For example, when the host apparatus 11 issues a command to write into NAND memories 2, the temperature controller 51*e* checks the temperature information about NAND memories 2, which is stored in the temperature management part 51*d*. Then the temperature controller 51*e* determines whether the temperature is higher than a predetermined value or not, and, and controls the heat generation element (i.e., issues a temperature control command) based on the result. The detailed description will be given below.

When power is on, the boot loader 51*f* loads each management program (FW) from NAND memories 2 to the SRAM 55. The initialization management section 51*g* initializes a controller or circuit in the drive control circuit 5.

<Configuration of NAND Memories>

Figure 3:
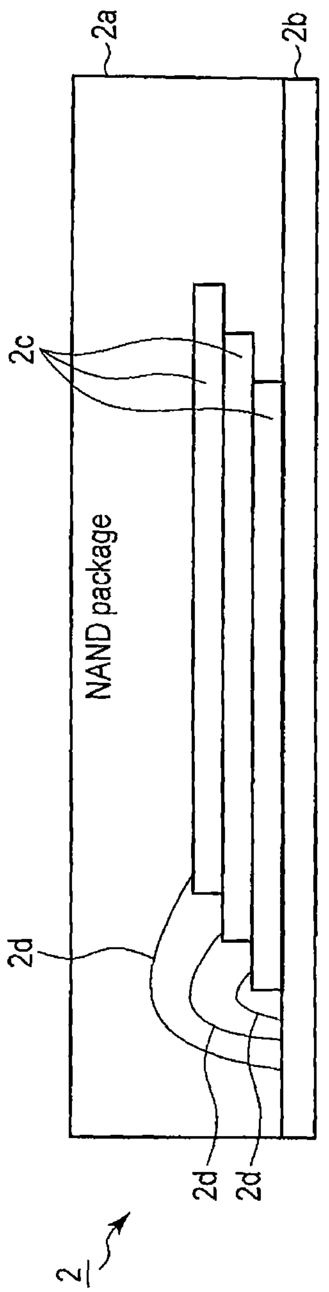
FIG. 3 is a schematic cross-sectional view of the basic configuration of a NAND memory according to the embodiment.

Next, the configuration of NAND memories 2 will be schematically described with reference to FIGS. 3 and 4. FIG. 3 is a schematic cross-sectional view of the basic configuration of each of NAND memories 2 according to the embodiments. FIG. 4 is a schematic block diagram of the basic configuration of a NAND chip according to the embodiments.

As shown in FIG. 3, a plurality of NAND chips are sealed in, for example, by a package 2*a* made of a resin, or a resin package 2*a*. Specifically, as shown in FIG. 3, NAND chips 1 to k (k is an integer of 1 or greater) (also simply called chips 2*c*) are laid one upon another on a printed board 2*b*. Each chip 2*c* is connected to a wire pattern (not shown) on the printed board 2*b* by wires 2*d*. An external connection terminal (e.g., BGA: Ball Grid Array) is provided on the back of the printed board 2*b*. The printed board 2*b*, chips 2*c*, and wires 2*d* are sealed in the resin package 2*a*, for example.

As shown in FIG. 4, an explanation is given taking as an example, a NAND chip 2*c* from the NAND chips 1 to k. The NAND chip 2*c* includes a memory cell array 20, a row decoder 21, a column gate 22, address register 23, a data input/output buffer 24, a command I/F 25, and a state machine 26.

The row decoder 21 includes a row address decoder and a word line driver. The row decoder 21 controls the potentials of word lines and select gate lines in the memory cell array 20 based on an address specified by an operation mode and row address signal.

The column gate 22 selects a bit line in the memory cell array 20 based on a column address signal. It is assumed that, to facilitate this, the column gate 22 also includes a Sense Amplifier (S/A).

Written or read data is input to or output from the memory cell array 20 via the Sense Amplifier and data input/output buffer 24 based on addresses selected by the row decoder 21 and column gate 22.

The address register 23 supplies address data, supplied to the data input/output buffer 24, to the memory cell array 20.

The data input/output buffer 24 is connected to the drive control circuit 5 via an external input/output section (also referred to as an external I/O). The data input/output buffer 24 receives an external control signal received from the drive control circuit 5, and data is transmitted or received between the drive control signal 5 and chip 2*c* via the external I/O.

The command I/F 25 supplies an external control signal, supplied from the data input/output buffer 24, to the state machine 26.

The state machine (operation control circuit) 26 determines operation modes (writing, deleting, reading, etc.) for the chip 2*c* based on the external control signal. According to the operation modes, the state machine 26 controls the operations of the row decoder 21, a column gate 22, etc.

The row decoder 21, the column gate 22, address register 23, data input/output buffer 24, command I/F 25, and state machine 26 are also referred to collectively as a peripheral circuit or the like.

<Outline of Memory Cell Array>

FIG. 5 is a schematic block diagram of the basic configuration of a memory cell array 20 according to the embodiments. FIG. 6 shows a circuit example of one of memory blocks shown in FIG. 5.

The memory cell array 20 is composed of a plurality of memory blocks, BLOCK 1 to BLOCK m (m is an integer of 1 or greater). The memory blocks BLOCK 1 to BLOCK m are arranged along a bit line BL (along a column).

As shown in FIG. 6, one memory block includes a plurality of NAND cells (also called a cell unit, or NAND string or the like) arranged in a word line WL (in a row).

One NAND cell includes: a plurality of memory cell transistors (also, simply called memory cells) MT connected in series; a select gate transistor ST1 connected to the drain of the memory cell transistor MT at one end; and a select gate transistor ST2 connected to the source of the memory cell at the other end.

Each memory cell transistor MT has: a charge accumulating layer formed on a semiconductor layer via a gate insulating film; another gate insulating film formed on the charge accumulating layer; and a control gate electrode formed on the gate insulating films. The number of the memory cell transistors MT is not limited to 8 but may be a number such as 16, 32, 64, 128, 256, or the like. Additionally, adjacent memory cell transistors MT share a source and drain. The memory cell transistors MT are arranged between the select gate transistors ST 1 and ST2 such that their current paths are connected in series. The drain area at one end of a memory cell transistor MT connected in series is connected to the source area of the select gate transistor ST1. The source area at the other end of the memory cell transistor is connected to the drain area of the select gate transistor ST2.

Bit lines BL0 to BLq-1 (q is an integer of 1 or greater) are connected to the drain of the select gate transistor ST1. A source line SL is connected to the source of the select gate transistor ST2. The bit lines BL0 to BLq-1 are also called bit lines BL collectively unless they are distinguished. Additionally, it is not necessary to have both the select transistors ST1 and ST2, but only one of these may be provided as long as it is able to select a NAND cell.

Word lines WL0-WLn-1 (n is an integer of 1 or greater) extend in a WL direction, and are connected by sharing memory cells adjacent to each other in the WL direction. For ease of explanation below, the word lines WL0 to WL7 are also simply called word lines WL unless they are distinguished.

The select gate lines SGD and SGS are connected as a group to the select transistors ST1 and ST2, respectively, of the memory cell.

Data is written collectively into the memory cell transistors MT connected to the same word line WL, and this unit is called a page. Further, data in NAND cells in the same row is erased collectively, and this unit is called a memory block.

With reference to FIG. 7, a plain view of the memory cell array 20 with the foregoing configuration will be described below.

As shown in FIG. 7, a plurality of striped active areas AA (active areas) extending in the direction of the bit lines BL are provided in a p-type semiconductor plate and in the direction of the word lines WL orthogonal to the direction of the bit lines BL. Formed between adjacent active areas AA are element separation areas STI (shallow trench isolations) extending in the direction of the bit lines BL. Thus, these element separation areas STI electrically separate the active areas AA.

On the semiconductor substrate striped word lines WL and select gate lines SGD and SGS are formed in the direction of the word lines WL so as to cross the active areas AA. In areas where the word lines WL and active areas AA intersect, the memory cell transistors MT are provided. Select transistors ST1 and ST2 are provided in the areas where the select gate lines SGD and SGS and active areas AA intersect, respectively.

Impurity diffusion layers, serving as source or drain areas for the memory cell transistors MT and select transistors ST1 and ST2 are formed in active areas AA between adjacent word lines WL, between the select gate lines, and between the word lines WL and select gate lines, in the direction of the bit lines BL.

Impurity diffusion layers formed in the active areas AA between the select gate lines SGD adjacently provided in the direction of the bit lines BL function as drain areas for the select transistors ST1. On each of these drain areas, a contact plug CP 1 is formed. The contact plug CP1 is connected to a striped bit line BL (not shown) provided in the direction of the bit lines BL.

Impurity diffusion layers formed in the active areas AA between the select gate lines SGS adjacently provided in the direction of the bit lines BL function as source areas for the select transistors ST2. On each of these source areas, a contact plug CP 2 is formed. The contact plug CP2 is connected to a source line SL (not shown).

Next, a cross-sectional configuration of a memory cell array 20 with the foregoing configuration will be described with references to FIGS. 8 and 9. FIGS. 8 and 9 are cross-sectional views taken along the lines A-A and B-B, respectively, of FIG. 7.

As shown in FIG. 7, an n-type well area (n-well) 201 is formed in the surface area of a p-type semiconductor substrate (p-substrate) 200. Further, a p-type well (p-well) 202 is formed on the n-type well 201. The p-type semiconductor substrate 200, an n-type well area 201, and a p-type well area 202 may be simply called semiconductor substrates 200 to 202.

Formed on the active areas AA of the p-type well area 202 is, for example, a silicon oxide film, which functions as a tunnel insulating film 204. Formed on the tunnel insulating film 204 are gate structures for the memory cell transistors MT and select transistors ST1 and ST2. The tunnel insulating film 204 for the memory cell transistors MT functions as a tunnel film, through which electrons tunnel.

The gate structure for each memory cell transistor MT has a laminated structure. Specifically, the gate structure includes: an electrode film 205 formed on the tunnel insulating film 204; another insulating film, 206, formed on the electrode film 205; and another electrode film, 207, formed on the insulating film 206. The electrode film 205 functions as an electric charge accumulating layer for accumulating electric charges. The insulating film 206 functions so as to confine electric charges within the electrode film 205. The electrode film 207 functions as a control gate (word lines WL).

Hereafter, the electrode film 205, insulating film 206, and electrode film 207 in each memory cell transistor MT may also be called an electric charge accumulating film 205, gate insulating film 206, and control gate electrode 207, respectively. The electric charge accumulating films 205 are separated for the memory cell transistors MT. The gate insulating films 206 and control gate electrode 207 are connected in common to memory cell transistors MT adjacently provided in the direction of the word lines WL. To be specific, each control gate electrode 207 share connections to adjacent active areas AA across element separation areas adjacent to this control gate electrode film 207 in the direction of the word lines WL.

The gate structure for each of the select transistors ST1 and ST2 includes: an electrode film 205 formed on the tunnel insulating film 204; another insulating film, 206, formed on part of the electrode film 205; and an electrode film 207 formed on the insulating film 206 and on the part of the electrode film 205. In the gate structure for each of the select transistors ST1 and ST2, part of the electrode film 205 is electrically connected to the electrode film 207. Here, for convenience sake, the electrode film 207 is also called a gate electrode 207. In each of the select transistors ST1 and ST2, the gate electrode 207 is connected in common to the gate electrode 207 adjacent to this one in the direction of the word lines WL. The gate electrodes 207 function as the select gate lines SGS and SGD, respectively.

In the surface of the p-type semiconductor substrate 200 and between the gate electrodes, n+ type impurity dispersion layers 203 are formed. Each n+ type impurity dispersion layer 203 is shared between adjacent transistors, and functions as a source (S) or drain (D). Each area (area directly below the gate electrode) between the source and drain adjacent to each other functions as a channel area, which serves as an area where electron moves. These gate electrodes, n+ impurity dispersion layers 203, and channel areas form the memory cell transistors MT and select transistors ST1 and ST2.

Furthermore, an inter-layer insulating film 208 is formed on the p-type semiconductor substrate 200 to cover the memory cell transistors MT and select transistors ST1 and ST2. Formed in the inter-layer insulating film 208 is a contact plug CP2 extending to the impurity dispersion layer (source) 203 of the source-side select transistor ST2.

Also, formed in the inter-layer insulating film 208 is a CP1 extending to the impurity dispersion layer (drain) 203 of the drain-side select transistor ST1.

Next, as shown in FIG. 8, the n-type well area 201 is formed in the surface area of the p-type semiconductor substrate (silicon substrate) 200 and the p-type well area 202 is formed in the n-type well area 201. Formed between the p-type well areas 202, tunnel insulating films 204, and electric charge accumulating films 205 of the memory cell transistors MT adjacently provided in the direction of channel width (i.e., the direction of the word lines WL) are, for example, PSZ (polysilazane) or the like, which serves as element separating insulating films (element separation areas) 209 of STI (Shallow Trench Isolation) type.

Formed on the electric charge accumulating films 205 and element separating insulating films 209 is the gate insulating film 206. Formed on the gate insulating film 206 is a control gate electrode 207. Formed on the control gate electrode 207 is the interlayer insulating film 208.

First Embodiment

Using the foregoing SSD as an example, next will be described a memory system according to the first embodiment, which changes the temperature of the NAND memories deliberately and writes or erases data in the NAND memories at a predetermined temperature.

<Outline of Memory System According to the First Embodiment>

First, the basic configuration of an SSD (memory system) 1 according to the first embodiment will be described with reference to FIG. 10. The basic configuration of the SSD is the same as that described above, and detailed explanation thereof is omitted. FIG. 10 is a schematic block diagram of the basic configuration of the memory system according to the first embodiment.

As shown in FIG. 10, in the SSD 1, a heat generation element (a temperature varying section) 8 is disposed on each NAND memory 2, for example. The heat generation element 8 is able to vary its own temperature by causing a dc current to flow in it. This heat generation element 8 may receive power directly from the external power source 10 without, for example, a power source circuit 6.

In the SSD 1, a temperature sensor 9 is disposed for measuring the temperature of NAND memories 2, for example. This temperature sensor 9 is connected to, for example, a first bus 50 of the drive control circuit 5.

Examples of the disposition of the temperature sensor 9 include, a central area of the region where the NAND memories 2 are arranged (see the temperature sensor 9*a* in FIG. 10), or an area separate from the NAND memories 2 (see the temperature sensor 9*b* in FIG. 10). Specifically, the temperature sensor 9*a* is surrounded by a plurality of NAND memories 2 (four NAND memories 2) and arranged nearer to the NAND memories 2 than to the drive control circuit 5. In contrast, the temperature sensor 9*b* is disposed nearer to the drive control circuit 5 than to the NAND memories 2.

Other than these areas, the temperature sensor 9 may be located at any place where the temperature of the NAND memories 2 can be measured. In the first embodiment, the number of the temperature sensors 9 may be one. A case with more than one temperature sensor 9 provided will be described below.

Next, referring to FIG. 11, the connection of the temperature sensor 9 according to the first embodiment relative to the drive control circuit 5 will be schematically described.

As shown in FIG. 11, the temperature sensor 9 is supplied with a clock from the drive control circuit 5 via a bus 50*a*. The temperature sensor 9 supplies measured temperature information to the drive control circuit 5 via a bus 50*b*.

<Structure of Peltier Element>

Next, the heat generation elements 8 according to the first embodiment will be explained. In the first embodiment, for example, a Peltier element is used as a heat generation element 8. A Peltier element is a thermoelectric transducer that has the effect of transferring heat from one side to the other by causing dc current to flow. That is, a Peltier element is a semiconductor element capable of cooling, heating, and controlling temperature.

FIG. 12 is a schematic cross-sectional view illustrating the arrangement of the NAND memories 2 relative to the Peltier elements 8 according to the first embodiment.

As shown in FIG. 12, the Peltier elements 8*a* are arranged on the NAND memories 2 arranged on the substrate 1*a* of the SSD 1. Alternatively, the Peltier elements 8*b* may be arranged on the back (it is assumed that the face on which the NAND memories 2 are arranged is a surface) of the substrate 1*a*. In this case, it is preferable that the Peltier elements be arranged below the corresponding NAND memories 2. For example, each of the Peltier elements 8*a* and 8*b* (also simply called Peltier elements 8) is sandwiched between, for example, ceramic substrates 81*a* and 81*b*. For example, the Peltier element 8*a* is arranged such that the ceramic substrate 81*a* is adjacent to the NAND memories 2.

Figure 13:
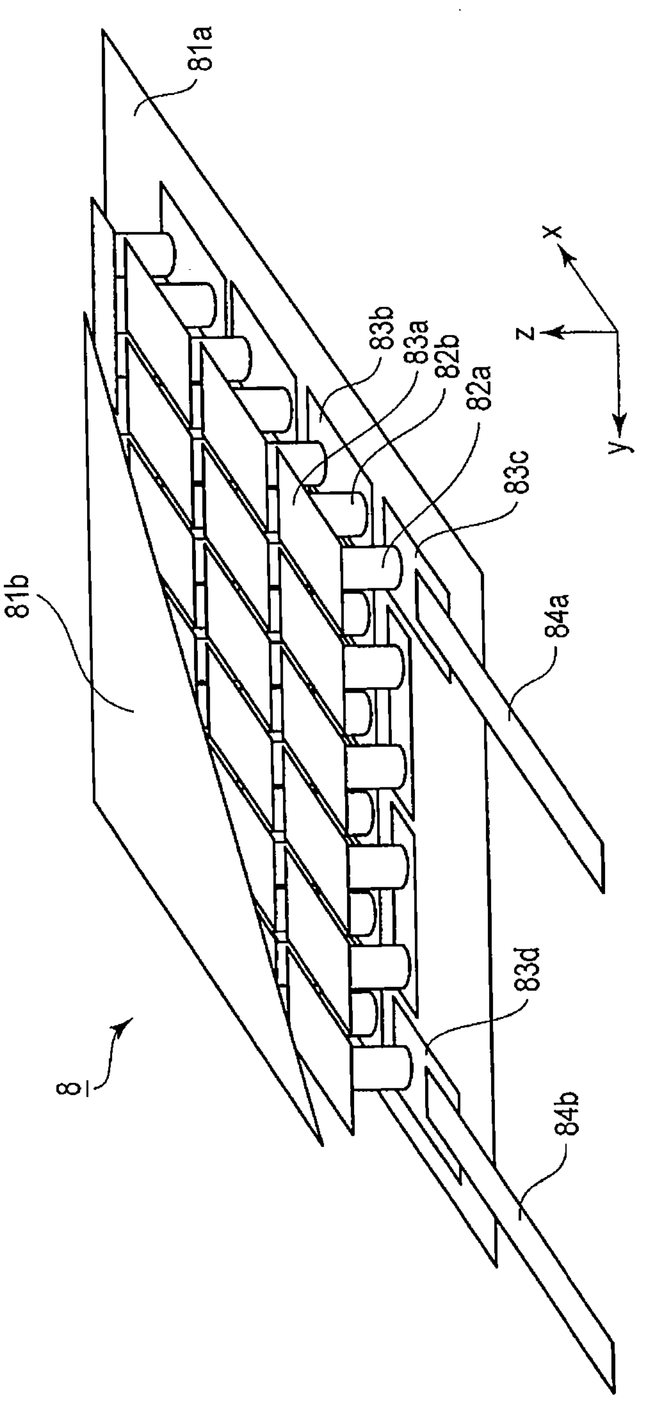
FIG. 13 is a schematic perspective view of the basic structure of each Peltier element according to the first embodiment.

FIG. 13 is a schematic perspective view of the basic configuration of each Peltier element 8 according to the first embodiment.

As shown in FIG. 13, the Peltier element 8 has a p-type thermoelectric semiconductor (also simply called a p-type semiconductor) 82*a* and n-type thermoelectric semiconductor (also simply called an n-type semiconductor) 82*b* connected by copper electrodes 83*a* and 83*b* between ceramic substrates 81*a* and 81*b* parallel to a plane extending in the direction of the x axis and the direction of the y axis orthogonal to the x axis. One end of this combination of the p-type semiconductor 82*a*, n-type semiconductor 82*b*, and copper electrodes 83*a* and 83*b* is connected to a lead wire 84*a* via a copper electrode 83*c*. The other end thereof is connected to the lead wire 84*b* via a copper electrode 83*d*.

FIG. 14 is a schematic cross-sectional view of the basic configuration of each Peltier element 8 according to the first embodiment.

As shown in FIG. 14, the copper electrodes 83*c* and 83*d* and the copper electrodes 83*b* are arranged on the ceramic substrate 81*a*. The copper electrode 83*c* is provided with the lead wire 84*a*, and the copper electrode 83*d* is provided with the lead wire 84*b* (not shown). Furthermore, the p-type semiconductor 82*a* is arranged on the copper electrode 83*c*, and one end of the copper electrode 83*a* is connected to the upper face of the p-type semiconductor 82*a* extending in the direction of the z axis perpendicular to the x-y plane. Connected to the other end of the copper electrode 83*a* is the upper face of the n-type semiconductor 82*b*. The lower face of the n-type semiconductor 82*b* extending in the direction of the z axis is connected to one end of the copper electrode 83*b* provided on the ceramic substrate 81*a*. Thus, the p-type semiconductor 82 and n-type semiconductor 82*b* are alternately connected via the copper electrodes 83 such that the p-type and n-type semiconductors 82*a* and 82 are electrically connected in series between the copper electrodes 83*c* and 83*d*. Additionally, the ceramic substrate 81*b* is provided so as to cover the copper electrodes 83*a*. Incidentally, the numbers, etc., of the p-type semiconductors 82*a*, the n-type semiconductors 82*b*, and the copper electrodes 83 of the Peltier element 8 are used as examples for explanatory purposes, and the numbers, etc., are not limited to these <Basic Operation of Peltier Elements>

Next, the basic operation of each of the Peltier elements 8 will be schematically described with reference to FIGS. 15 and 16. FIGS. 15 and 16 are cross-sectional views schematically illustrating the basic operation of each of the Peltier elements 8 according to the first embodiment.

As shown in FIG. 15, a current is caused to flow from the lead wire 84*a*, and a dc current is caused to flow from the p-type semiconductor 82*a* to the n-type semiconductor 82*b* (see the arrow I1 in FIG. 15). As a result, a heat dissipation phenomenon occurs in each of the PN connection parts (i.e., the copper electrodes 83*a*), and a heat absorption effect occurs in each of the NP connection parts (i.e., the copper electrodes 83*b*). Consequently, the temperatures of the copper electrodes 83*a* and ceramic substrate 81*b* are higher than those obtained before the current is caused to flow in each of the Peltier elements 8, whereas the temperatures of the copper electrodes 83*b* and ceramic substrate 81*a* are lower than those obtained before the current is caused to flow in each of the Peltier elements 8.

As shown in FIG. 16, a current is caused to flow from the lead wire 84*b* (now shown) and dc current is caused to flow from the n-type semiconductor 82*b* to the p-type semiconductor 82*a* (see the arrow 12 in FIG. 16). As a result, a heat dissipation phenomenon occurs in each of the PN connection parts (i.e., the copper electrodes 83*b*), and a heat absorption effect occurs in each of the NP connection parts (i.e., the copper electrodes 83*a*). Consequently, the temperatures of the copper electrodes 83*b* and ceramic substrate 81*a* are higher than those obtained before the current is caused to flow in the Peltier element 8, whereas the temperatures of the copper electrodes 83*a* and ceramic substrate 81*b* are lower than those obtained before the current is caused to flow in the Peltier element 8.

By reversing the polarity of the power source, heat transfer also reverses. Therefore, changing the direction of the current allows selection of heat dissipation or absorption in each of the copper electrodes 83*a* and 83*b*.

<Method for Connecting the Peltier Elements>

Next, a method for connecting the Peltier elements 8 and an external power source 10 will be described.

FIG. 17 illustrates the connections of the external power source 10 relative to each Peltier element 8. In the SSD1, switches 10*a* and 10*b* are provided for connecting the Peltier element 8 and external power source 10.

As shown in FIG. 17, the lead wires 84*a* and 84*b* of the Peltier element 8 are connected to switches 10*a* and 10*b* respectively. According to a command given by a temperature controller 51*e* connected to the switch 10*b*, the switches 10*a* and 10*b* operate in conjunction, for example.

The switch 10*a* is connected to either a node N1, which is supplied with power by the external power source 10, or a node N2, which is supplied with a grounded electric potential. The switch 10*b* is connected to either a node N4, which is supplied with power by the external power source 10, or a node N3, which is supplied with a grounded electric potential.

Next, referring to FIGS. 18 and 19, current flowing in each Peltier element 8 according to the first embodiment will be schematically described.

As shown in FIG. 18, where the switches 10*a* and 10*b* are connected to the nodes N1 and N2 respectively, current flows from the external power source 10, through the node N1, lead wire 84*a*, Peltier element B, and lead wire 84*b*, to the node N3 (see the arrow 13 in FIG. 18). Thereby, the temperature of the ceramic substrate 81*b* increases whereas the temperature of the ceramic substrate 81*a* decreases.

As shown in FIG. 19, where the switches 10*a* and 10*b* are connected to the nodes N2 and N4 respectively, current flows from the external power source 10, through the node N4, lead wire 84*b*, Peltier element 8, and lead wire 84*a*, to the node N2 (see the arrow 14 in FIG. 19). Thereby, the temperature of the ceramic substrate 81*a* increases whereas the temperature of the ceramic substrate 81*b* decreases.

By switching between the switches 10*a* and 10*b* in such a manner, the directions of heat dissipation and heat absorption of the Peltier element 8 can be controlled.

<Operation of Memory System According to the First Embodiment>

Referring to FIG. 20, next will be described the operation 1000 for writing in each NAND memory 2 of the memory system 1 according to the first embodiment.

[Step S1001]

When a command (a specific command) to write in NAND memory 2 is input to the ATA command processing part 51*b* of a CPU 51 from a host apparatus 11, the temperature controller 51*e* causes the ATA command processing section 51*b* to temporarily stop execution of the command, and causes, for example, the temperature sensor 9 to measure the temperature of the SSD 1 or NAND memories 2. Then, the temperature sensor 9 supplies the measurement result (temperature information) to a temperature management section 51*d*. This temperature information is stored in the temperature management section 51*d*. Alternatively, the temperature sensor 9 may measure the temperature of the SSD 1 or NAND memories 2 periodically (e.g., every predetermined clock interval) and supply the measurement result to the temperature management section 51*d*.

[Step S1002]

The temperature controller 51*e* checks the temperature information of the SSD1 or NAND memories 2, held in the temperature management section 51*d*, and determines whether this temperature is higher than a temperature threshold $T_{th1}$ (which can be altered if required) or not.

[Step S1003]

If the temperature controller 51*e* determines in step S1002 that the temperature is higher than the predetermined temperature threshold $T_{th1}$, a temperature control command to decrease the temperature of the ceramic substrate 81*a* disposed in contact with the NAND memory 2 of the corresponding Peltier element 8 is issued to the ATA command processing section 51*b* by the temperature controller 51*e*, for example. Then, based on the temperature control command, the ATA command processing section 51*b* selects one of the above-mentioned switches, provided between the Peltier element 8 and external power source 10, such that the ceramic substrate 81*a* absorbs heat, thereby supplying power from the external power source 10 to the Peltier element 8 via the lead wire 84*a*. At this time, control may be exerted so that the temperature of the NAND memories 2 is approximately 25° C., for example. Alternatively, control may be exerted so that the temperature of the NAND memories 2 is approximately 30° C. lower than ambient temperature (e.g., room temperature).

[Step S1004]

If the temperature is lower than the predetermined temperature threshold $T_{th1}$ in step S1002, writing in the NAND memories 2 is carried out. Specifically, the temperature controller 51*e* permits the writing command that has been temporarily stopped by the ATA command processing section 51*b*. The ATA command processing section 51*b* receive this permission and gives the command to write in the NAND memories 2.

In the case of a deleting operation other than one involving writing (i.e., in the case of passing electrons through the tunnel insulating film 204) also, the same operation as the foregoing operation 1000 is performed.

Referring to FIG. 21, next will be described an operation 1100 in which writing or deleting in the NAND memories 2 of the memory system according to the first embodiment is not performed.

[Step S1101]

If the command to write in the NAND memories 2 is not input to the CPU even after the elapse of a predetermined time (e.g., a predetermine clock interval) for example, the temperature controller 51*e* causes the temperature sensor 9 to measure the temperature of the SSD 1 or NAND memories 2. The temperature sensor 9 supplies the measurement result (temperature information) to the temperature management section 51*d*. This temperature information is held in the temperature management section 51*d*. The temperature sensor 9 may measure the temperature of the SSD1 or NAND memories 2 periodically, and supply the measurement result to the temperature management section 51*d*.

[Step S1102]

The temperature controller 51*e* checks the temperature information held in the temperature management section 51*e* and determines whether this temperature is higher than a predetermined temperature $T_{th2}$ (which can be altered if required) or not.

[Step S1103]

If the temperature controller 51*e* determines in step S1102 that the temperature is lower than the predetermined temperature threshold $T_{th2}$, a temperature control command to increase the temperature of the ceramic substrate 81*a* disposed in contact with the NAND memory 2 of the corresponding Peltier element 8 is issued to the ATA command processing section 51*b* by the temperature controller 51*e*, for example. Then, based on the temperature control command, the ATA command processing section 51*b* selects one of the above-mentioned switches, provided between the Peltier element 8 and external power source 10, such that the ceramic substrate 81*a* dissipates heat, thereby supplying power from the external power source 10 to the Peltier element 8 via the lead wire 84*b*. At this time, control may be exerted so that the temperature of the NAND memories 2 is approximately 85° C., for example. Alternatively, control may be exerted so that the temperature of the NAND memories 2 is approximately 40° C. higher than ambient temperature (e.g., room temperature).

Thus, in the first embodiment, an operating current is caused to flow while the NAND memories 2 are maintained at a low temperature; when the operating current is not caused to flow in the NAND memories 2, the NAND memories 2 are left to stand at a high temperature.

The temperature thresholds $T_{th1}$ and $T_{th2}$ in the operations 1000 and 1100 respectively may be different or the same.

<Effects of Operating Memory System According to the First Embodiment>

In the first embodiment described above, the memory system (SSD) 1 has the nonvolatile semiconductor storages (NAND memories) 2 able to hold data and a temperature measurement section (temperature sensor) 9 provided to measure the temperature of the semiconductors 2. The memory system 1 includes: the temperature varying sections (heat generation elements) 8 configured to change the temperature of the semiconductor storages 2; the transmitter (ATA command processing section) 51*b* configured such that data received from the host apparatus 11 is transferred to the semiconductor storages 2; a temperature storage (temperature management section) 51*d* configured to store temperature information received from the temperature measurement section 9; and the control circuit 5 (drive control circuit) 5 having the temperature controller 51*e* configured to control the temperature varying sections 8 based on the temperature information stored in the temperature storage 51*d*. The temperature controller 51*e* varies control of the temperature varying sections 8 such that the temperature of the semiconductor storages 2 differs between when operations of writing or deleting data in the memory circuit 20 are performed and when these operations are not performed. To be specific, the temperature controller 51*e* controls the temperature varying sections 8 such that the temperature of the semiconductor storages 2 during the writing or deleting of data in the memory circuit 20 is lower than that when these operations are not performed.

Now, the effects of operating the memory system according to the first embodiment will be described in detail with reference to the drawings 22 to 24.

FIG. 22 is a graph illustrating the relation between the density of electrons trapped in the tunnel insulating film 204 of each of the memory cell transistors MT and the distance of the tunnel insulating film 204 from the semiconductor substrate 202. The horizontal axis indicates distance from the boundary between the semiconductor substrate 202 and tunnel insulating film 204 in the direction extending from the semiconductor substrate 202 toward the charge accumulating layer 205. The vertical axis indicates the density of electrons trapped in the tunnel insulating films 204. T1 indicates the case in which an operation such as wiring or deleting (hereafter also called a W/E operation) is performed at high temperature and the NAND memories 2 are left to stand at low temperature. T2 indicates the case where the W/E operation is performed at low temperature and the NAND memories 2 are left to stand at low temperature. T3 indicates the case where the W/E operation is performed at high temperature and the NAND memories 2 are left to stand at high temperature. T4 indicates the case where the W/E operation is performed at low temperature and the NAND memories 2 are left to stand at high temperature.

By moving electrons between the semiconductor substrate 202 and each charge accumulating film 205 via the tunnel insulating film 204 during W/E operation of each memory cell transistor M, electrons are trapped in the tunnel insulating films 204.

A W/E operation performed at high temperature traps more electrons in the tunnel insulating film 204 than when performed at low temperature.

The distance electrons trapped in the tunnel insulating film 204 escape (i.e., detrap) into the semiconductor substrate 202, is called the "tunneling front". The tunneling front refers to a distance x from the boundary between the semiconductor substrate 202 and tunnel insulating film 204 in the direction extending from the semiconductor substrate 202 toward the charge accumulating layer 205, which distance electrons trapped in the tunnel insulating film 204 escape into the semiconductor substrate 202. Specifically, electrons present in the semiconductor substrate 202 as far as the tunneling front are detrapped into the semiconductor substrate 202 from the tunnel insulating film 204. The depth x of the tunneling front is defined by $x=s\cdot\ln(t/t_0)$. The symbol s is the gradient of a graph (described below), t is the temperature of the memory cell transistors MT, $t_0$ is a constant determined for each substance. As the temperature increases, s becomes higher. Therefore, the value of x increases and the detrap distance of the tunnel insulating film 204 from the semiconductor film 202 increases. It is also found from the graph that, at T4, the number of trapped electrons is small and the degree of detrap is also small.

Repeating W/E operations increases the number of neutral traps in the tunnel insulating film 204 of the memory cell transistors MT. An increase in the number of neutral traps in the tunnel insulating film 204 is defined by, for example, $k_{n+1}=k_n+(M-k_n)a-bDK_n$ (expression 2). The symbol $K_n$ is the number of neutral traps and n is the number of times that the W/E operation is performed. M is the upper limit (constant) of the number of generated neutral traps, and $(M-K_n)$ is the number of sites (i.e., margins) where neutral traps have not yet been generated. Further, is the proportion of traps generated per W/E operation, and b is the proportion of present traps that disappear per unit time. D is the time interval between the n-th W/E operation and (n+1)th W/E operation.

If the temperature of the memory cell transistors MT increases, the coefficient b also increases, thus restricting any increase in the number of traps in the tunnel insulating film 204.

Next, a threshold for the memory cell transistors MT will be described with reference to FIG. 23. The horizontal axis indicates a threshold Vt for the memory cell transistors MT and the vertical axis indicates the number of cells. The threshold distribution C1 indicates a threshold distribution right after, for example, a writing operation, and the threshold distributions C2 to C4 respectively indicate threshold distributions when the NAND memories 2, or the memory cell transistors MT, are left to stand for a predetermined times after a writing operation. A memory-cell threshold changes depending on the time for which the NAND memories 2 are left to stand after a writing operation. In terms of the length of time for which the NAND memories 2 are left to stand, the threshold distribution C3 is longer than the threshold distribution C2, and the threshold distribution C4 is longer than the threshold distribution C3. The symbol n1 represents a predetermined probability of existence. Here, the lower limit VA of the threshold distribution C1 at n1 is used as a reference. The difference between the lower limit VB of the threshold distribution C2 at n1 and the reference threshold VA is assumed to be dVt. Similarly, each of the differences between the lower limit VC of the threshold distribution C3 and the reference threshold VA and between the lower limit VD of the threshold distribution C4 and the reference threshold VA is assumed to be dVt. If the lower limit of the threshold distribution at n1 falls below the threshold VR1, cells with a threshold lower than the threshold RV1 cannot be relieved by ECC. For, example, the lower limit VC of the threshold distribution C3 at n1 is equal to the threshold VR1. Cells (see area E1) beyond the threshold VR1 in the threshold distribution C3 are not relieved by ECC. However, even if cells in this area E1 cannot be relieved, the reliability of the NAND memories can be maintained.

The lower limit VD of the threshold distribution C4 at n1 is lower than the threshold VR1. Cells beyond the threshold VR1 in the threshold distribution C4 (see area E2) cannot be relieved by ECC. In such a case, since the number of cells that cannot be relieved by ECC is so many, the reliability of the NAND memories cannot be maintained. Therefore, the lower limit of the distribution area at n1 falling below the threshold VR1 is undesirable in assuring NAND memory reliability.

Figure 24:
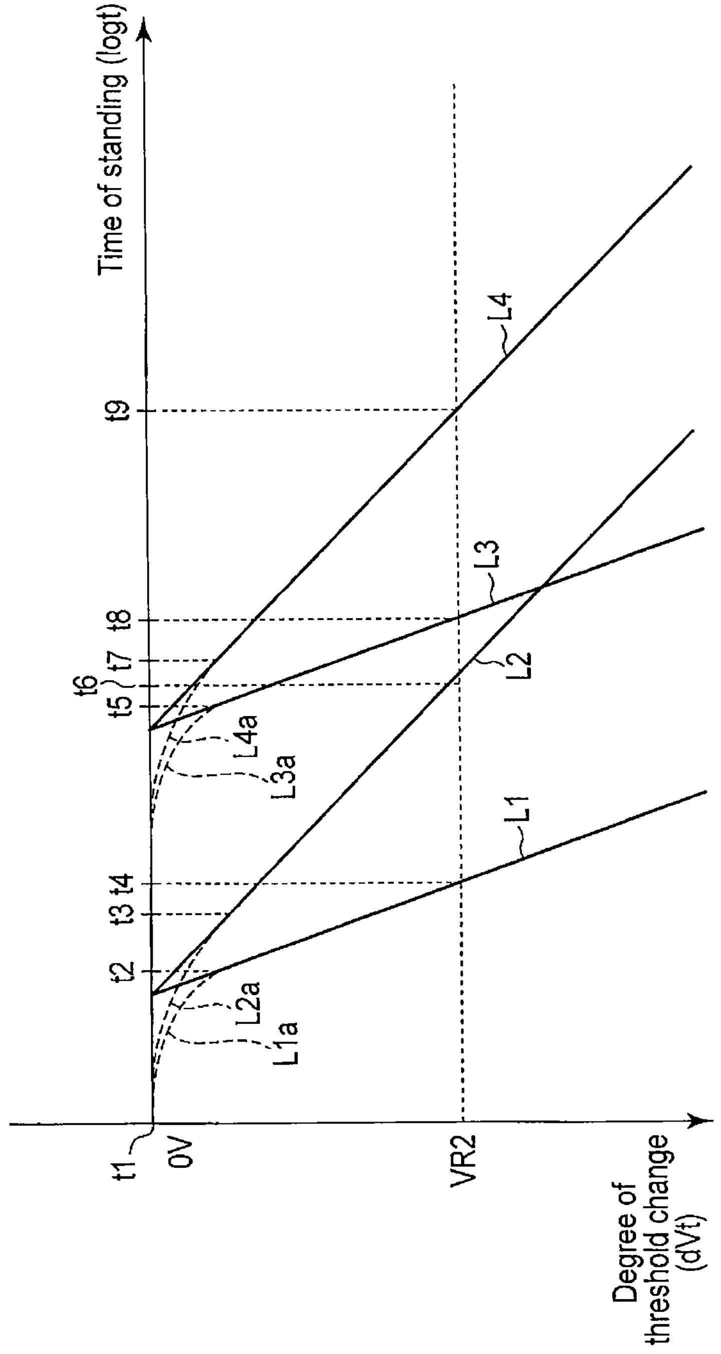
FIG. 24 is a graph illustrating the relation between the time of standing for each memory cell transistor and the degree of threshold change.

FIG. 24 is a diagram illustrating the relation between the time of standing (i.e., the time for which the NAND memories are left to stand) and the degree of threshold change. The horizontal axis indicates the time for which the memory transistors MT are left to stand after data are written in the memory cell transistors MT, and the vertical axis indicates the degree of change in the threshold of the memory cell transistors Mt. On the horizontal axis, time t1 at which a change in the threshold for the memory transistors MT begins to increase is used as a reference. The VR2 on the vertical axis indicates a value dVt obtained by subtracting VR1 from the threshold VA explained above. That is, if the value dVt exceeds the threshold VR2, the lower limit of the threshold distribution of the memory cell transistors MT at n1 indicated in FIG. 23 falls below the threshold VR1, resulting in an increased number of memory cell transistors MT that cannot be relieved by ECC. Therefore, the threshold VR2 is assumed to be the point at which the memory cell transistors MT expire.

In the graph, L1*a* (a broken line) indicates the relation between the time for which the memory cell transistors MT are left to stand at low temperature after a W/E operation at high temperature and the threshold change. L1 is a line approximating L1*a*.

In the graph, L2*a* (another broken line) indicates the relation between the time for which the memory transistors MT are left to stand at low temperature after a W/E at low temperature and the threshold change. L2 is a line approximating L2*a*. In the graph, L3*a* (another broken line) indicates the relation between the time for which the memory transistors MT are left to stand at high temperature after a W/E operation at high temperature and the threshold change. L3 is a line approximating L3*a*. In the graph, L4*a* (the other broken line) indicates the relation between the time for which the memory transistors MT are left to stand at high temperature after a W/E operation at low temperature and the threshold change. L4 is a line approximating L4*a*.

At time t2, L1*a* and L1 coincide. At time t3, L2*a* and L2 coincide. At time t4, the degree of threshold change of L1 reaches the threshold VR2. That is, the memory cell transistors MT left to stand after a W/E operation at high temperature expire at time t4. At time t5, L3*a* and L3 coincide. At time t6, the degree of threshold change of L2 reaches the threshold VR2. That is, the memory cell transistors MT left to stand at low temperature after a W/E operation at low temperature expires at time t6. At time t7, L4*a* and L4 coincide. At time t8, the degree of threshold change reaches the threshold value VR2. That is, the memory cell transistors MT left to stand at high temperature after a W/E operation at high temperature expires at time t8. At time t9, the degree of threshold change of L4 reaches the threshold VR2. That is, the memory cell transistors MT left to stand at high temperature after a W/E operation at low temperature expires at time t9. There is a relationship between each of the times as follows: t1<t2<t3<t4<t5<t7<t8<t9.

When electric charges are not moved, higher temperature makes recovery from deterioration quicker. When a W/E operation (i.e., the movement of electric charges) in the NAND memories 2 is performed at low temperature, and the NAND memories 2 are left to stand at high temperature at times other than this, fewer electrons are trapped in the tunnel insulating film. And more electrons trapped in the tunnel insulating film can be detrapped, allowing further recovery of the tunnel insulating film and reducing deterioration of the tunnel insulating film. Incidentally, it is known that causing current to flow in, for example, a thin film of silicon oxide ($SiO2$) may lead to leakage in the form of a low electric field (i.e., SILC: Stress Induced Leakage Current). However, in such a mode also, deterioration of the insulating film can be reduced or slowed by decreasing the temperature at which electrons move in the tunnel insulating film and increasing the temperature at which electrons do not move in the tunnel insulating film. In addition, the degree dVt of threshold change of the memory cell transistors MT can be reduced to its least compared to other cases. Accordingly, the lives of the memory cell transistors MT can be longer than the lives of memory cell transistors in other states.

Second Embodiment

Next, an SSD (memory system) according to the second embodiment will be described using the foregoing SSD as an example. The memory system according to the second embodiment differs from the memory system according to the first embodiment in that the temperature of the NAND memories 2 is increased during writing/deleting operations and that it is decreased when these operations are not performed. The basic configuration of an SSD 1 according to the second embodiment and basic temperature control are identical to those described in the first embodiment, and detailed explanations thereof are omitted.

<Operation of Memory System According to the Second Embodiment>

Referring to FIG. 25, the operation of writing data in NAND memories 2 in the memory system 1 according to the second embodiment will be described.

[Steps S1201, S1202]

Operations the same as the foregoing operations in steps S1001 and S1002 are performed.

[Step S1203]

As in step S1103 described above, if the temperature controller 51*e* determines in step S1202 that the temperature is lower than a predetermined temperature threshold $T_{th1}$, a temperature control command to increase the temperature of a ceramic substrate 81*a* disposed in contact with the NAND memory 2 of the corresponding Peltier element 8 is issued to the ATA command processing section 51*b* by the temperature controller 51*e*, for example. Then, the ATA command processing section 51*b* selects one of the above-mentioned switches, provided between the Peltier element 8 and external power source 10, such that the ceramic substrate 81*a* dissipates heat, thereby supplying power from the external power source 10 to the Peltier element 8 via the lead wire 84*b*.

[Step S1204]

If the temperature is higher than the predetermined temperature threshold $T_{th1}$ in step S1202, writing data is written in the NAND memories 2. Specifically, the temperature controller 51*e* permits to issue a writing command that has been temporarily stopped by the ATA command processing section 51*b*. The ATA command processing section 51*b* receives this permission and issues the command to write data in the NAND memories 2.

For example, in the case of the deleting operation also, the memory system according to the second embodiment operates in the same manner as the operation 1200 described above.

Referring to FIG. 26, next will be described an operation 1300 where writing or deleting in the NAND memories 2 of the memory system according to the second embodiment is not performed.

[Steps S1301 and S1302]

Operations the same as the foregoing operations in steps S1101 and S1102 are performed.

[Step S1303]

As in step S1003, if the temperature controller 51*e* determines in step S1302 that the temperature is higher than the predetermined temperature threshold $T_{th2}$, a temperature control command to decrease the temperature of the ceramic substrate 81*a* disposed in contact with the NAND memory 2 of the corresponding Peltier element 8 is issued to the ATA command processing section 51*b* by the temperature controller 51*e*, for example. Then, based on the temperature control command, the ATA command processing section 51*b* selects one of the above-mentioned switches, provided between the Peltier element 8 and external power source 10, such that the ceramic substrate 81*a* absorbs heat, thereby supplying power from the external power source 10 to the Peltier element 8 via the lead wire 84*a*.

In this step, heat absorption does not have to be carried out forcibly using the Peltier elements 8. Flow may wait until the temperature of the NAND memories 2 decreases. Additionally, temperature thresholds $T_{th1}$ and $T_{th2}$ in the operations 1200 and 1300 respectively may be the same or different.

Thus, in the second embodiment, an operating current is caused to flow while NAND memories 2 are maintained at high temperature; where the operating current is not caused to flow in the NAND memories 2, the NAND memories 2 are left to stand at low temperature.

<Effects of Operating of the Memory System According to the Second Embodiment>

In the first embodiment described above, the temperature controller 51*e* controls the temperature varying sections 8 such that the temperature of the semiconductor storages 2 during the writing or deleting of data in the memory circuit 20 is higher than when these operations are not performed.

In the memory cell transistors MT, the data holding characteristics of these transistors MT generally degrade when their temperatures become higher, but stress during writing is decreased. In the second embodiment, the W/E operation (i.e., the movement of electric charges) in the NAND memories 2 is performed at high temperature, and the NAND memories 2 are left to stand at high temperature at times other than this. Accordingly, writing stress can be decreased, thus making it possible to improve the data holding characteristics when the NAND memories 2 are left to stand.

Third Embodiment

Next, a memory system according to the third embodiment will be described using the foregoing SSD as an example. The memory system according to the third embodiment erases data from a memory block after leaving the memory block as it is at high temperature before deletion of the data from this memory block.

The method 1400 for deleting data from a memory block in the memory system 1 according to the third embodiment will be described, with reference to FIG. 17. There is a case where if data held in a given memory block has become superfluous, the data is erased from the memory block simultaneously, and the memory block can be kept empty so as to be reused. A memory block emptied by such an operation is called a spare block.

In order to prepare for a spare block, a host apparatus 11 issues a deletion command for a memory block. At this time, the command input in an ATA processing part 51*b* is briefly held in a temperature controller 51*e*. Unless the temperature controller 51*e* permits an ATA processing section 51*b* to issue a command, a deleting operation for a memory block is not performed.

[Step S1402]

The temperature controller 51*e* issues a temperature control command and heats a target memory block to a predetermined temperature (e.g., 55° C.) by using heat generation elements. While the temperature of the target memory block is kept higher, a memory block is left to stand until a predetermined time (e.g., approximately 10 sec) elapses. At this time, if required, the temperature controller 51*e* measures the temperature using a temperature sensor able to measure the temperature of the target memory block most efficiently.

Before increasing the temperature of the target memory block, the temperature controller 51*e* may check temperature information stored in a temperature management section 51*d* or may cause the temperature sensor 9 to measure the temperature of the target memory cell block. If the temperature of the target memory cell block is equal to or higher than a predetermined temperature, the memory block is left to stand until a predetermined time has elapsed, without issuing a temperature control command.

[Step S1403]

When the predetermined time has elapsed, the temperature controller 51*e* permits the ATA command controller 51*b* to issue a command. Thereby, the ATA command controller 51 issues a command to erase the memory block, supplied from the host apparatus, and performs a deleting operation for the memory block.

<Effects of Operating Memory System According to the Third Embodiment>

According to the third embodiment described above, when data stored in a memory block has become superfluous and the data is erased from the memory block in order to reuse the memory block, the memory block is left to stand for a predetermined length of time at high temperature before deletion of the data from the memory block.

As described above, when data is held in a memory block, the temperature of the memory block increases, possibly leading to deterioration of data holding characteristics. Therefore, it is not desirable to make the temperature of the memory block high. However, when the tunnel insulating film of the memory cell transistors is to be recovered, it is desirable to make the temperature of the memory block high. Additionally, making the temperature of the memory block high while electrons are being held in a charge accumulating layer makes it possible to recover the tunnel insulating film more efficiently.

In the third embodiment, a description was given of a spare block. However, the embodiment is not limited to this, but can recover a tunnel insulating film by increasing the temperature of a memory cell block in which data has become superfluous. Additionally, any control method or the like for memory cell block temperature may be employed. Data does not have to be held in the memory block.

Fourth Embodiment

Next, a memory system according to the fourth embodiment will be described using the foregoing SSD as an example. The memory system according to the fourth embodiment differs from the memory system according to the first embodiment in that the one according to the fourth embodiment does not use Peltier elements 8 as heat generation elements. The fourth embodiment uses heat generation elements 80 designed such that a current is caused to flow in each heat generation element by causing a potential difference between both ends of this element and, as a result, heat is generated. The heat generation elements according to the fourth embodiment are supplied with power by a power source circuit 6 based on, for example, a temperature control command issued by a temperature controller 51*e*.

An example of an arrangement of heat generation elements for a memory system according to the fourth embodiment will be described with reference to FIGS. 28 to 34.

FIG. 28 is a circuit diagram for a memory cell block, illustrating, as an example, arrangement of the heat generation elements. As shown in FIG. 28, each W (piece of tungsten) serving as a heat generation element 80 is arranged along a word line WL.

Figure 29:
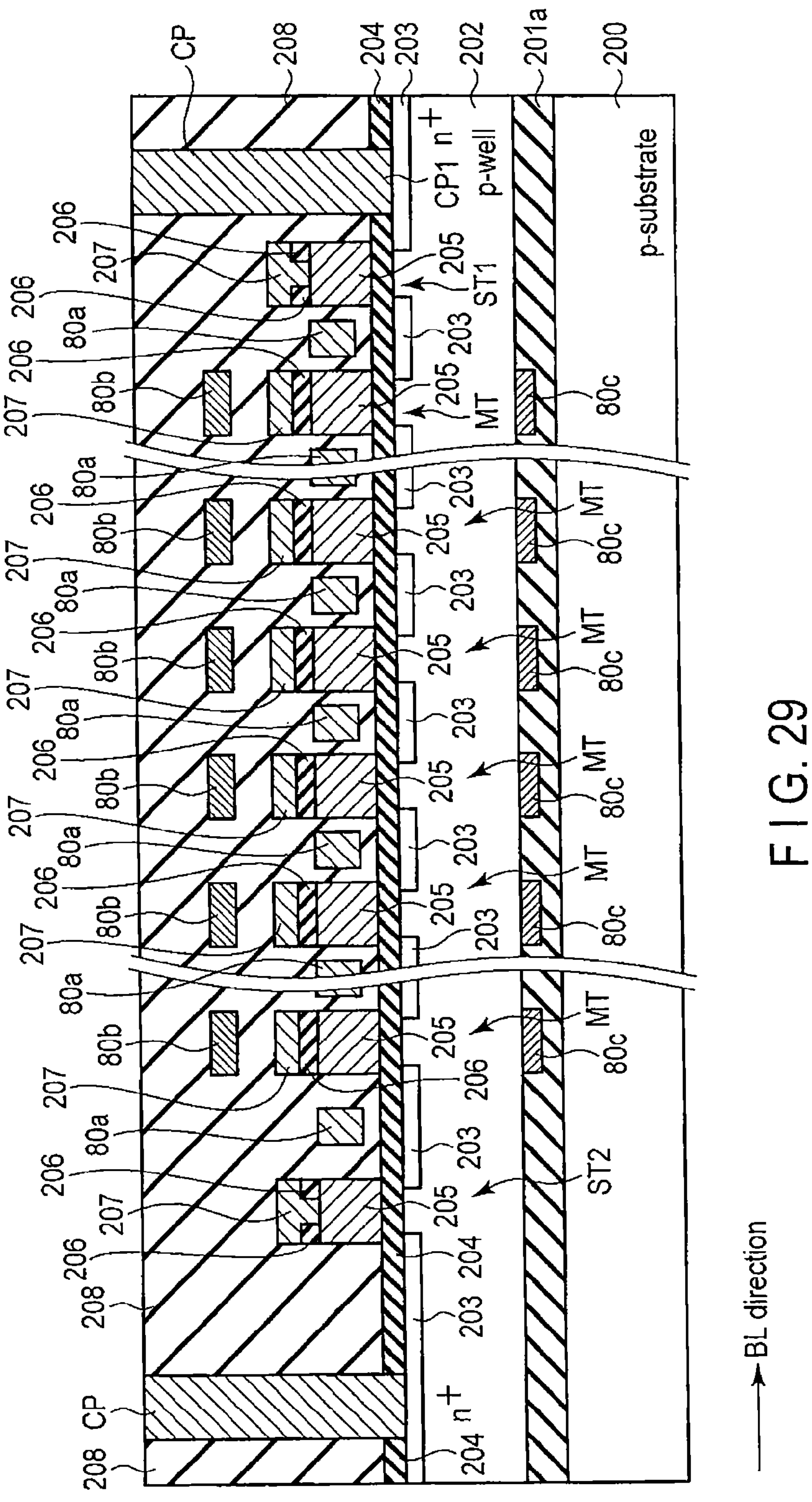
FIG. 29 is a cross-sectional view taken along each bit line of FIG. 28.

FIG. 29 is a cross-sectional view of NAND cells along each bit line BL. Here, three methods for arranging the heat generation elements are shown as examples. The heat generation elements 80 can be arranged as indicated by heat generation elements 80*a*, 80*b*, and 80*c* in FIG. 29. Each of the heat generation elements 80*a* is arranged between the charge accumulating layers 205 of the memory cell transistors MT provided adjacently. Each of the heat generation elements 80*b* is arranged above the control gate electrode 207 of the corresponding memory cell transistor MT. Each of the heat generation elements 80*c* is embedded in an insulating layer 201*a* below the gate structure (a laminated structure formed from a charge accumulating film 205, gate insulating film 206, and control gate electrode 207) of the corresponding memory cell transistor MT when an insulating layer 201*a*, such as a silicon oxide, is provided on a semiconductor substrate 200 and a semiconductor layer 202 is formed on the insulating layer 201*a*.

FIG. 30 is a circuit diagram for a memory cell block, illustrating, as another example, arrangement of the heat generation elements. As shown in FIG. 30, the heat generation elements 80 are arranged along each bit line BL.

FIG. 31 is a cross-sectional view of the NAND cells along each word line WL. Here, three methods for arranging the heat generation elements are shown as examples. The heat generation elements 80 may be arranged as indicated by heat generation elements 80*d*, 80*e*, and 80*f* in FIG. 31. Each of the heat generation elements 80*d* is arranged in the element separating insulating film 209 between the memory cell transistors MT provided adjacently. Each of the heat generation elements 80*e* is provided above the control gate electrode 207 of the corresponding memory cell transistor MT. Each of the heat generation elements 80*f* is embedded in the insulating layer 201*a* below the gate structure (a laminated structure formed from a charge accumulating film 205, gate insulating film 206, and control gate electrode 207) of the corresponding memory cell transistor MT when an insulating layer 201*a*, such as a silicon oxide, is provided on the semiconductor substrate 200 and a semiconductor layer 202 is formed on the insulating layer 201*a*.

FIG. 32 is a circuit diagram for a memory cell block, illustrating, as another example, arrangement of the heat generation elements 80. As shown in FIG. 32, the heat generation elements 80 are independent of one another, and are arranged near the memory cell transistors MT (e.g., above control gate electrodes or below the gate structures of the memory cell transistors MT).

FIG. 33 is a circuit diagram for a memory cell block, illustrating, as another example, arrangement of the heat generation elements 80. As shown in FIG. 33, the heat generation elements 80 are arranged so as to overlap the memory cell block. The heat generation elements 80 may be provided, for example, in an interlayer insulating film 208, in the semiconductor substrates 200 and 201, in the semiconductor layer 202, or in the insulating layer 201*a* (described below).

FIG. 34 is a cross-sectional view of NAND cells along each bit line BL. As shown in FIG. 34, the heat generation elements 80*g* are embedded over the entire surface of the insulating layer 201*a* below the gate structures of the memory cell transistors MT when an insulating layer 201*a*, such as a silicon oxide film, is provided on a semiconductor substrate 200 and a semiconductor layer 202 is formed on the insulating layer 201*a*.

In the fourth embodiment, tungsten is used for the heat generation elements. However, the embodiment is not limited to this, and any material can be used as long as the temperature of the material increases when current flows in it.

Although several methods for arranging the heat generation elements 80 have been described, it is preferable that these heat generation elements 80 be arranged nearer to the tunnel insulating film 204.

<Effects of Operating Memory System According to the Fourth Embodiment>

The fourth embodiment uses tungsten (W) for the heat generation elements 80. Since tungsten can be provided near the memory cell transistors MT, desired control of the temperature of the memory cell transistors MT can be achieved. That is, tungsten allows finer control of the temperature than do the Peltier elements 8.

Fifth Embodiment

Next, a memory system according to the fifth embodiment will be described using the foregoing SSD as an example. The memory system according to the fifth embodiment differs from the memory system according to the first embodiment in that the one according to the fifth embodiment does not use heat generation elements but uses a heat generation method employing a dummy writing operation.

The flow of a dummy writing operation according to the fifth embodiments will now be described using as an example the operation 1200 (i.e., the operation of increasing the temperature of the NAND memories when writing data in the NAND memories 2) of the memory system according to the second embodiment.

First, a command to write in the NAND memories 2 is issued to an ATA command processing section 51*b* from a host apparatus 11. Upon recognizing the input of the command into the ATA command processing section 51*b* from the host apparatus 11, a temperature controller 51*e* measures the temperature of the NAND memories 2 stored in the temperature management section 51*d* (refer to step S1201 in FIG. 25). Then, the temperature controller 51*e* determines whether the temperature of the NAND memories 2 has reached a predetermined temperature or not (refer to step S1202 in FIG. 25). If the temperature controller 51*e* determines that the temperature of the NAND memories 2 has not reached the predetermined temperature, the temperature controller 51*e* issues a temperature control command to a NAND controller 54. In response to this, the NAND controller 54 issues a data-in command to a target NAND memory 2 and does not select any memory cell array 20. The operation in which, without actually writing data in a memory cell array 20 as described above, data is transmitted and received between peripheral circuits is called a dummy writing operation, for example. By performing a dummy writing operation, for example, the charge pump and so on of the data input/output buffer 24 (refer to FIG. 3) are operated by data input. However, data is not actually written in the memory cell array 20. In this way, the dummy writing operation can increase the temperature of peripheral circuits (e.g., a temperature varying section) of the memory cell array 20 (refer to step S1203 in FIG. 25). For example, after a predetermined time has elapsed, the temperature controller 51*e* measures the temperature of the NAND memories 2. If the controller 51*e* determines that the temperature of the NAND memory 2 has reached the predetermined temperature, the temperature controller 51*e* permits the issuing of the writing command that has been temporarily stopped by the NAND controller 54. In response to this, the NAND controller 54 issues the command to write in the NAND memories 2.

As described above, the fifth embodiment indirectly increases the temperature of the memory cell array 20 by increasing the temperatures of peripheral circuits through a dummy writing operation. This temperature adjustment method may also be applied in, for example, the first and third embodiments.

<Effect of Operating Memory System According to the Fifth Embodiment>

The fifth embodiment described above controls the temperatures of peripheral circuits by repeating input/output of data into/from the peripheral circuits while not actually writing data in the memory circuit 20. This makes it possible to achieve the foregoing first to third embodiments with fewer components.

Data that is input for the dummy writing operation may be supplied from a host apparatus 11.

Sixth Embodiment

Next, a memory system according to the sixth embodiment will be described using the foregoing SSD as an example. The memory system according to the sixth embodiment differs from the memory system according to the first embodiment in that a temperature sensor is disposed for each NAND package 2 or each NAND chip 2*c*.

Figure 36A:
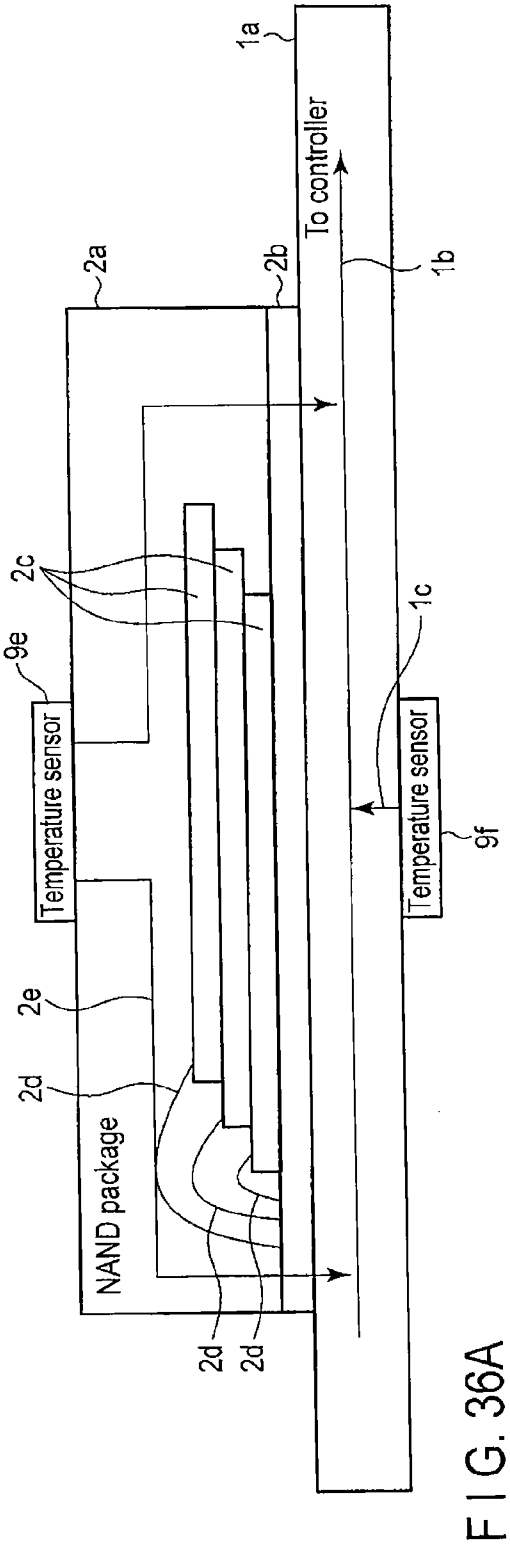
FIG. 36A is a schematic cross-sectional view of another basic configuration of a NAND memory according to the sixth embodiment.
Figure 36B:
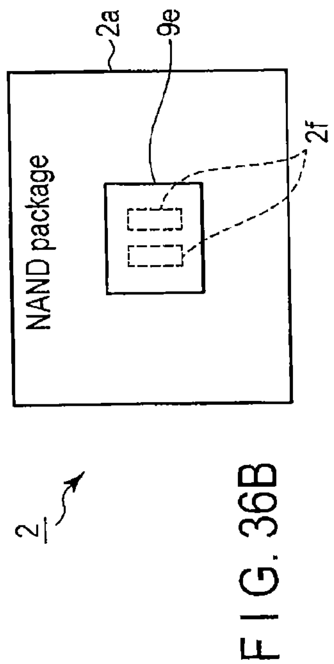
FIG. 36B is a schematic plane view of the basic configuration of a NAND memory according to the sixth embodiment.

Referring to FIGS. 35 to 37, examples of arrangement of the temperature sensors 9 of the memory system 1 according to the sixth embodiment will be described. FIG. 35 is a schematic cross-sectional view of a basic configuration of each NAND memory 2 according to the sixth embodiment. FIG. 36A is a schematic cross-sectional view of another basic configuration of each NAND memory 2 according to the sixth embodiment. FIG. 36B is a schematic plane view of the basic configuration of each NAND memory 2 according to the sixth embodiment. FIG. 37 is a schematic block diagram of the basic configuration of each NAND chip 2*c* according to the sixth embodiment.

As shown in FIG. 35, the temperature sensors 9 may be sealed in a NAND package 2, for example. The temperature sensor 9*c* is disposed, for example, on the surface of the uppermost memory chip 2*c* in the NAND package 2. In this case, a wire 2*e* is connected from the temperature sensor 9*c* to a wire pattern (not shown) on a printed board 2*b*. Alternatively, another temperature sensor, 9*d*, is disposed on the printed board 2*b*. In this case, the temperature sensor 9*d* is directly connected to the wire pattern on the printed board 2*b*. These temperature sensors 9*c* and 9*d* are sealed in a package 2*a*.

As shown in FIG. 36, the temperature sensors 9 may be disposed near the NAND package 2. For example, as shown in FIGS. 35A and 35B, the temperature sensor 9*e* may be disposed on the package 2*a*. In this case, the wire 2*e* is passed into the package 2*a* through an opening 2*f* made in this package 2*a*. The wire 2*e* is connected to a bus 3 provided on a substrate 1*a*. Alternatively, the temperature sensor 9*f* may be provided on the back (the face on which the NAND package 2 is provided is assumed to be a surface) of the substrate 1*a* located in a lower position in the NAND package 2. In this case, the temperature sensor 9*f* is connected to the bus 3 via a wire 1*c*.

As shown in FIG. 37, the temperature sensors 9 may be provided, for example, in the memory chip 2*c*. For example, the temperature sensor 9*g* may be provided near a memory cell array 20. Alternatively, the temperature sensor 9*h* may be provided in a row decoder 21. Alternatively, the temperature sensor 9*i* may be provided in the middle of the memory cell array 20.

Figure 38:
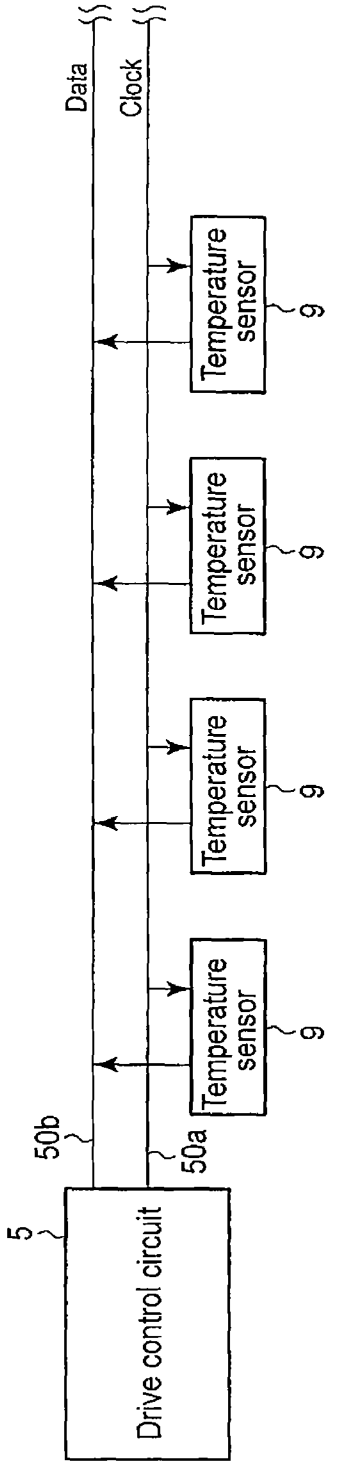
FIG. 38 is a diagram schematically illustrating the connection of the temperature sensors according to the sixth embodiment relative to a drive control circuit.

Referring to FIG. 38, connection of a temperature sensor according to the sixth embodiment relative to a drive control circuit will now be described.

As shown in FIG. 38, each temperature sensor 9 is supplied with a clock by the drive control circuit 5 via a bus 50*a*. Each temperature sensor 9 supplies the drive control circuit with information about measured temperature, as data, via a bus 50*b*.

<Effects of Operating Memory System According to the Sixth Embodiment>

According to the sixth embodiment, the temperature sensors 9 can be provided in required locations. Accordingly, it is possible to accurately manage the temperature of each NAND memory 2 or NAND chip 2*c* as well as the temperature inside the SSD.

Seventh Embodiment

Next, a memory system according to the seventh embodiment will be described using the foregoing SSD as an example. The memory system according to the seventh embodiment differs from the memory system according to the first embodiment in that the one according to the seventh embodiment measures and hence controls the temperature of each NAND package 2 or each NAND chip 2*c*.

<Temperature Table>

For example, as described in the sixth embodiment, by disposing a temperature sensor 9 for each NAND package 2 or each NAND chip 2*c*, temperature information for each NAND package 2 or NAND chip 2*c* can be stored in a temperature management section 51*d*.

FIG. 39 is a temperature table for holding temperature information for each NAND chip (for each chip). As shown in FIG. 39, identification numbers (also referred to as chip No) are assigned to the NAND chips 2*c*. In this case, one temperature sensor 9 is disposed for each NAND chip 2*c*, as shown in FIG. 37.

FIG. 40 is a temperature table (for each package) used to hold temperature information for each NAND package. As shown in FIG. 40, identification numbers (also referred to as package No) are assigned to the NAND packages 2. In this case, the temperature sensors 9 have to be disposed for the corresponding NAND packages 2, as shown in FIGS. 35 and 36.

<Application of Temperature Tables>

Next, a brief description is given of the case where the temperature tables described above are applied for each NAND chip in the operation 1000 of writing in the NAND chips of the memory system according to the first embodiment.

Upon input of a command (a predetermined command) into a CPU 51 to write data in each NAND chip 2*c*, a temperature controller 51*e* causes each temperature sensor 9 to measure the temperature of the corresponding NAND chip 2*c*. Then, each temperature sensor 9 supplies the measurement result (temperature information) to the temperature management section 51*d*. These items of temperature information are held in the temperature table (for each chip) of the temperature management section 51*d* and labeled with the identifiers for the corresponding NAND chips 2*c*. Each temperature sensor 9 may measure the temperature of the corresponding NAND chip 2*c* regularly and supply it to the temperature management section 51*d* (refer to step S1001 in FIG. 20).

Subsequently, the temperature controller 51*e* checks the temperature control table of the temperature management section 51*d*, and determines whether if there are any NAND chips 2*c* at temperatures higher than a predetermined temperature threshold $T_{th}$ (refer to step S1002 in FIG. 20).

In step S1002, if the temperature controller 51*e* determines that there are not any NAND chips 2*c* at temperatures lower than the predetermined temperature threshold $T_{th}$, a temperature control command is issued to decrease the temperature of a specific NAND chip 2*c*. In order to decrease this temperature, a Peltier element 8 may be used or this NAND chip 2*c* may be cooled with air (i.e., this NAND chip 2*c* may be left to stand) (refer to step S1003 in FIG. 20). Incidentally, the number of NAND chips 2*c* requiring cooling may be selected, as necessity requires. For example, only the NAND chip 2*c* with the lowest temperature among the NAND chips 2*c* may be selected for cooling.

In step S1002, if there are NAND chips 2*c* at temperatures higher than the predetermined threshold $T_{th1}$, a writing operation is performed in the NAND chip 2*c* closest to the most desirable temperature (this temperature can be set as necessity requires) among the NAND chips 2*c* (refer to step S1004 in FIG. 20). For example, where the temperature threshold $T_{th1}$ has been set as 50° C., and a desirable temperature has been set as 80° C., the writing operation is performed in the semiconductor No. 1 that is at least 50° C. and closest to 80° C.

Incidentally, where an operating current is caused to flow in the NAND memories 2 as in a deleting operation other than the writing operation, that is, where electrons are passed through a tunnel insulating film, the operation is performed as described above.

Next, a brief description is given of the case where the foregoing temperature table is applied for each NAND chip 2*c* in the operation 1100 where data is not written in or erased from the NAND memories of the memory system according to the first embodiment.

For example, if a command to write in the NAND chips 2*c* is not input to the CPU for a predetermined length of time, the temperature controller 51*e* causes each temperature sensor 9 to measure the temperature of each NAND chip 2*c*. Then, the measurement result (temperature information) of each temperature sensor 9 is held in the temperature table (for each chip) of the temperature management section 51*d*, labeled with the identifiers for the corresponding NAND chips 2*c* (refer to step S1101 in FIG. 21).

Subsequently, the temperature controller 51*e* checks the temperature control table of the temperature management section 51*d*, and determines whether there are any NAND chips 2*c* lower than a predetermined temperature threshold $T_{th}$ (refer to step S1102 in FIG. 21).

In step S1102, if the temperature controller 51*e* determines that there is a NAND chip 2*c* lower than the predetermined temperature threshold $T_{th}$, a temperature control command is issued to increase the temperature of this NAND chip 2*c*. In order to increase this temperature, a Peltier element 8 or W may be used or a heat generation method using dummy data input to the NAND chip 2*c* may be used (refer to step S1103 in FIG. 21).

The temperature table can also be applied in the operations 1200 and 1300 described in the second embodiment, although a detailed explanation of such application is omitted here.

Temperature control for each NAND package can be exerted in the same manner as the foregoing temperature control for each NAND chip.

<Effects of Operating Memory System According to Seventh Embodiment>

The seventh embodiment described above uses temperature information for each NAND memory 2 or NAND chip 2*c*, thereby enabling finer control of the temperature of each NAND memory 2 or NAND chip 2*c*.

In order to control the temperature of each NAND chip 2*c*, it is preferable to use a heat generation method that allows temperature control for each chip, as described in the fourth and fifth embodiments.

Eighth Embodiment

Next, a memory system according to the eighth embodiment will be described using the foregoing SSD as an example. The memory system according to the fifth embodiment differs from the memory system according to the first embodiment in that the one according to the eighth embodiment uses the Seebeck effect of Peltier elements 8 in order to utilize regeneration energy in the system of an SSD 1. The Seebeck effect refers to a known physical phenomenon in which a semiconductor element generates electricity by its being sandwiched between objects of different temperatures.

Figure 41:
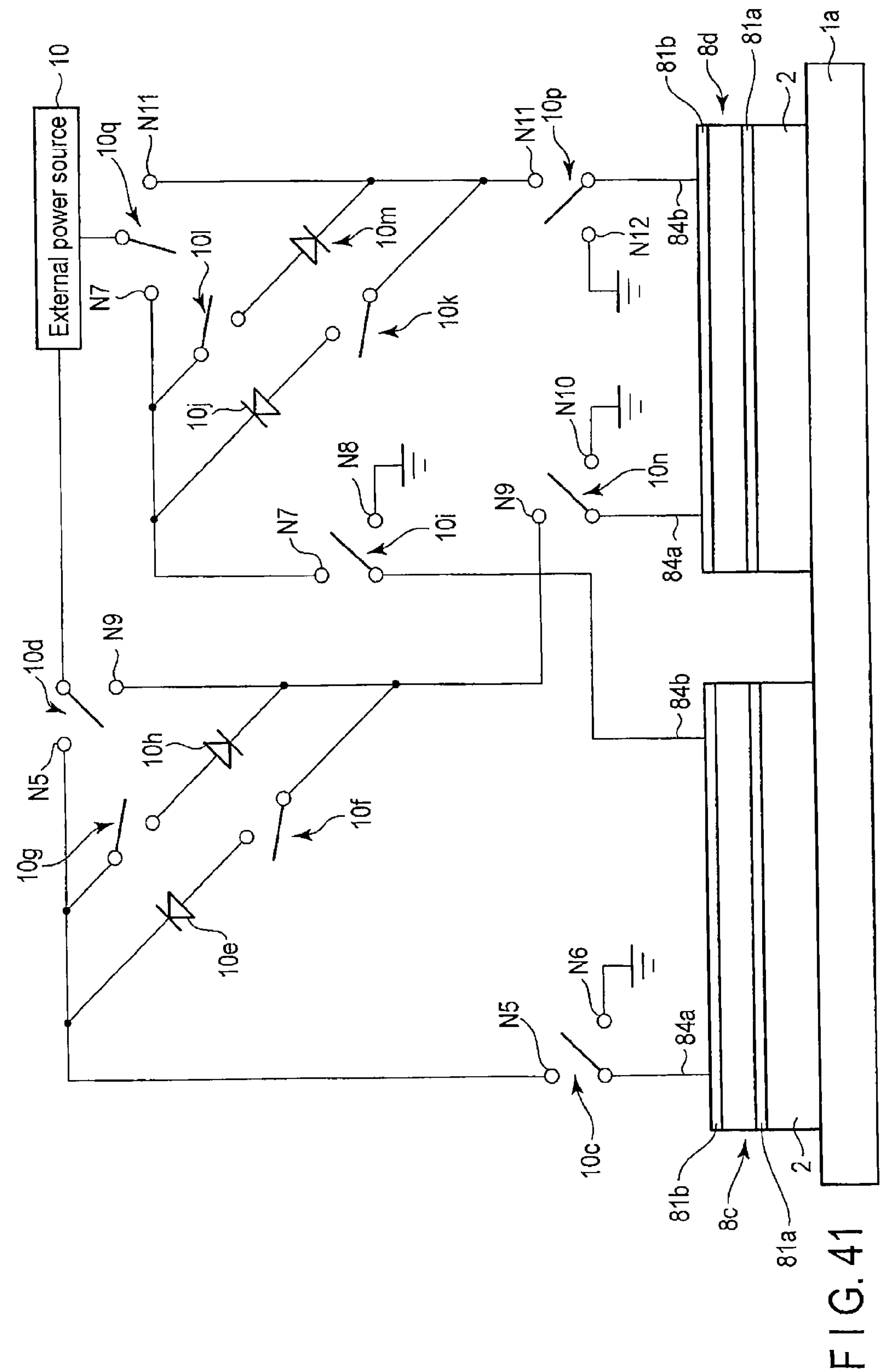
FIG. 41 illustrates an example of the operation of a circuit in a case where two adjacent Peltier elements are electrically connected to each other.

FIG. 41 illustrates the relation of the external power source 10, Peltier element 8*c* and Peltier element 8*d* in terms of connection. Provided in the SSD 1 are switches 10*c*, 10*d*, 10*f*, 10*g*, 10*i*, 10*k*, 10*l*, 10*n*, 10*p*, and 10*q* for connecting the Peltier elements 8*c* and 8*d* and rectifying devices 10*e*, 10*h*, 10*j*, and 10*m*. The switches 10*c*, 10*d*, 10*f*, 10*g*, 10*i*, 10*k*, 10*l*, 10*n*, 10*p*, and 10*q* operate according to commands from, for example, a temperature controller 51*e*.

FIG. 41 illustrates an example of electrically connecting at least the two Peltier elements 8*c* and 8*d* adjacent to each other. The Peltier elements 8*c* and 8*d* are arranged such that the ceramic substrate 81*a* sides thereof are in close contact with the upper faces of the corresponding NAND memories 2.

A lead wire 84*a* for the Peltier element 8*c* is connected to the switch 10*c*. This switch 10*c* switches connection to nodes N5 or N6. Connected to the node N5 are the rectifying device 10*e*, switch 10*f*, and switch 10*g*. The node N6 is supplied with a grounded potential. A lead wire 84*b* for the Peltier element 8*c* is connected to the switch 10*i*. This switch 10*i* switches connection to nodes N7 or N8. Connected to node N7 are the rectifying device 10*j*, switch 10*k* and switch 10*l*. The node N8 is supplied with a grounded potential.

A lead wire 84*a* for the Peltier element 8*d* is connected to the switch 10*n*. This switch 10*n* switches connection to nodes N9 or N10. Connected to the node N9 are the switch 10*f*, rectifying device 10*h*, and switch 10*g*. The node N10 is supplied with a grounded potential. A lead wire 84*b* for the Peltier element 8*d* is connected to the switch 10*p*. This switch 10*p* switches connection to nodes N11 or N12. Connected to node N11 are the switch 10*k*, rectifying device 10*m*, and switch 10*l*. The node N12 is supplied with a ground potential.

Connected to one end of the external power source 10 is the switch 10*d* for switching connection to nodes N5 or N9, and connected to the other is a switch 10*q* switching connection to nodes N7 or N11.

Figure 42:
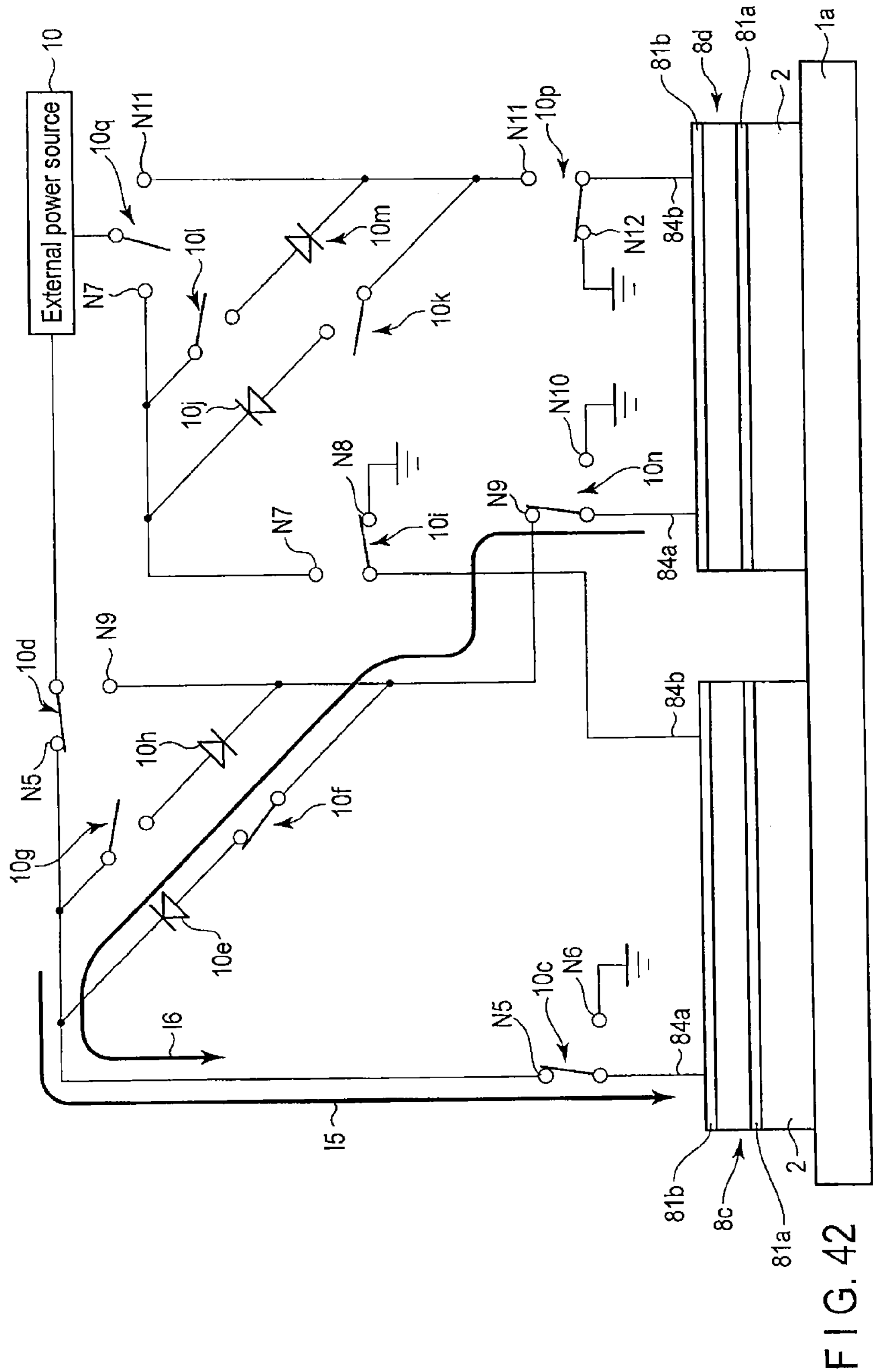
FIG. 42 illustrates an example of the operation of a circuit in a case where two adjacent Peltier elements are electrically connected to each other.

Referring to FIG. 42, a method will be described next in which heat (i.e., the temperature difference between the ceramic substrates 81*a* and 81*b*) accumulated in the Peltier element 8*d* is reused in the Peltier element 8*c* as electric current. It is assumed that electric current is caused to flow in the Peltier element 8*d* from, for example, the lead wire 84*a*, so that the ceramic substrate 81*a* is absorbing heat and the ceramic substrate 81*b* is dissipating heat.

As shown in FIG. 42, when the switch 10*c* is connected to the node N5, the switch 10*d* is also connected to the node N5, and the switch 10*i* is connected to the node N8, current flows from the external power source 10, via the node N5 and lead wire 84*a*, to the Peltier element 8*c* (see the arrow 15 in FIG. 42). Also, when the switch 10*n* is connected to the node N9, the switch 10*f* is turned on, and the switch 10*p* is connected to the node N12, current flows from the lead wire 84*a* of the Peltier element 8*d*, via the node N9, rectifying element 10*e*, node N5, the lead wire 84*a* of the Peltier element 8*c*, to the Peltier element 8*c* (see the arrow I6 in FIG. 42) based on the temperature difference between the ceramic substrates 81*a* and 81*b* of the Peltier element 8*d*. Thus, current can be supplied to the Peltier element 8*c* by using the temperature difference between the ceramic substrates 81*a* and 81*b* of the Peltier element 8*d*.

Figure 43:
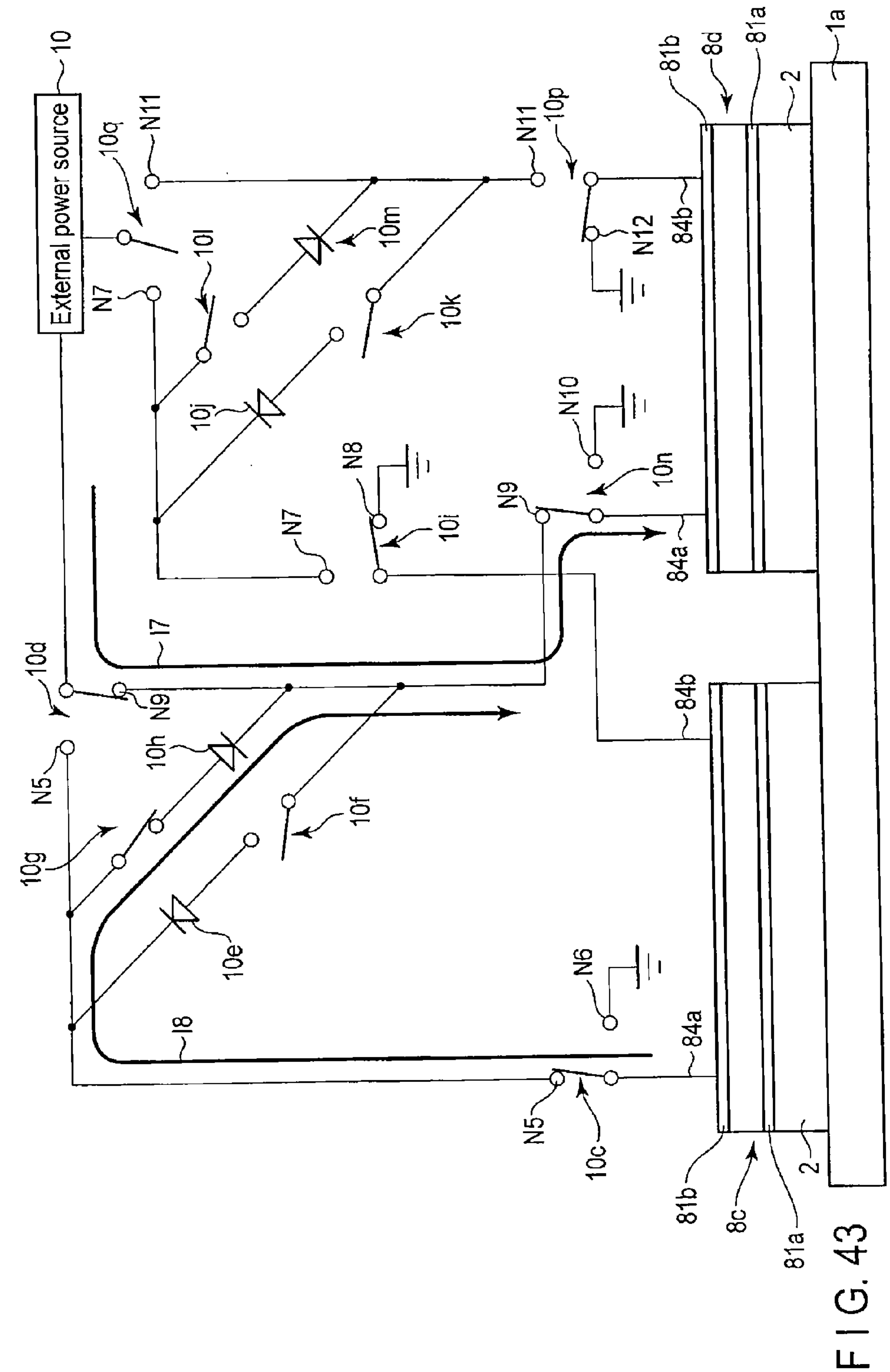
FIG. 43 illustrates an example of the operation of a circuit in a case where two adjacent Peltier elements are electrically connected to each other.

Referring to FIG. 43, also will be described a method where heat accumulated in the Peltier element 8*c* is reused in the Peltier element 8*d* as electric current. It is assumed that electric current is caused to flow in the Peltier element 8*c* from, for example, the lead wire 84*a*, so that the ceramic substrate 81*a* is absorbing heat and the ceramic substrate 81*b* is dissipating heat.

As shown in FIG. 43, when the switch 10*n* is connected to the node N9, the switch 10*d* is also connected to the node N9, and the switch 10*p* is connected to the node N12, current flows from the external power source 10, via the node N9 and lead wire 84*a*, to the Peltier element 8*d* (see the arrow I7 in FIG. 43). Also, when the switch 10*c* is connected to the node N5, the switch 10*g* is turned on, and the switch 10*i* is connected to the node N8, current flows from the lead wire 84*a* of the Peltier element 8*c*, via the node N5, rectifying element 10*h*, node N9, the lead wire 84*a* of the Peltier element 8*d*, to the Peltier element 8*d* (see the arrow I8 in FIG. 43) based on the temperature difference between the ceramic substrates 81*a* and 81*b* of the Peltier element 8*c*. Thus, current can be supplied to the Peltier element 8*d* by using the temperature difference between the ceramic substrates 81*a* and 81*b* of the Peltier element 8*c*.

Figure 44:
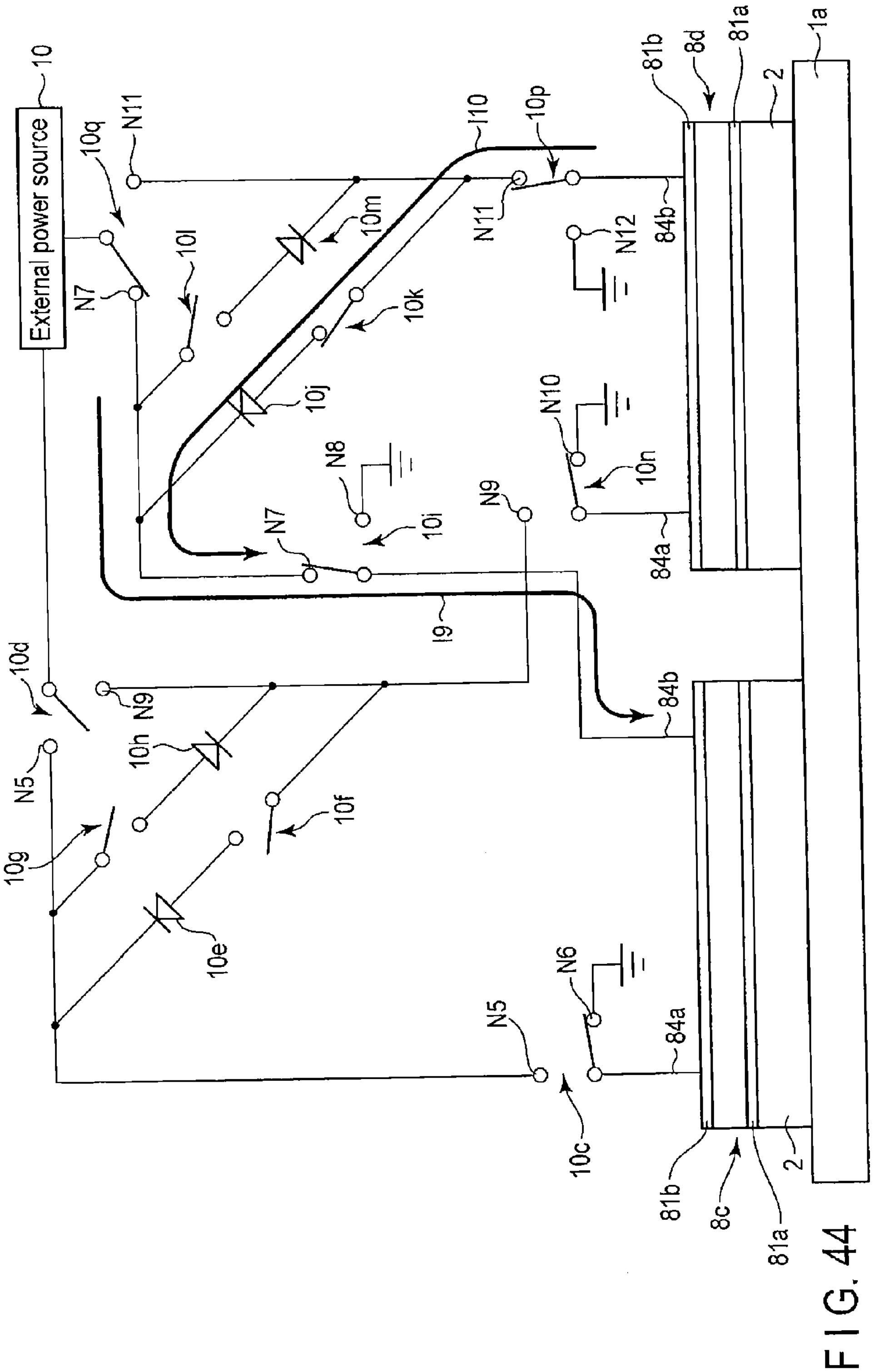
FIG. 44 illustrates an example of the operation of a circuit in a case where two adjacent Peltier elements are electrically connected to each other.

Referring to FIG. 44, also will be described a method where heat accumulated in the Peltier element 8*d* is reused in the Peltier element 8*c* as electric current. It is assumed that electric current is caused to flow in the Peltier element 8*c* from, for example, the lead wire 84*b*, so that the ceramic substrate 81*a* is dissipating heat and the ceramic substrate 81*b* is absorbing heat.

As shown in FIG. 44, when the switch 10*i* is connected to the node N7, the switch 10*q* is also connected to the node N7, and the switch 10*c* is connected to the node N6, current flows from the external power source 10, via the node N7 and lead wire 84*b*, to the Peltier element 8*c* (see the arrow I9 in FIG. 44). Also, when the switch 10*p* is connected to the node N11, the switch 10*k* is turned on, and the switch 10*n* is connected to the node N10, current flows from the lead wire 84*b* of the Peltier element 8*d*, via the node N11, rectifying element 10*j*, node N7, the lead wire 84*b* of the Peltier element 8*c*, to the Peltier element 8*c* (see the arrow I10 in FIG. 44) based on the temperature difference between the ceramic substrates 81*a* and 81*b* of the Peltier element 8*d*.

Figure 45:
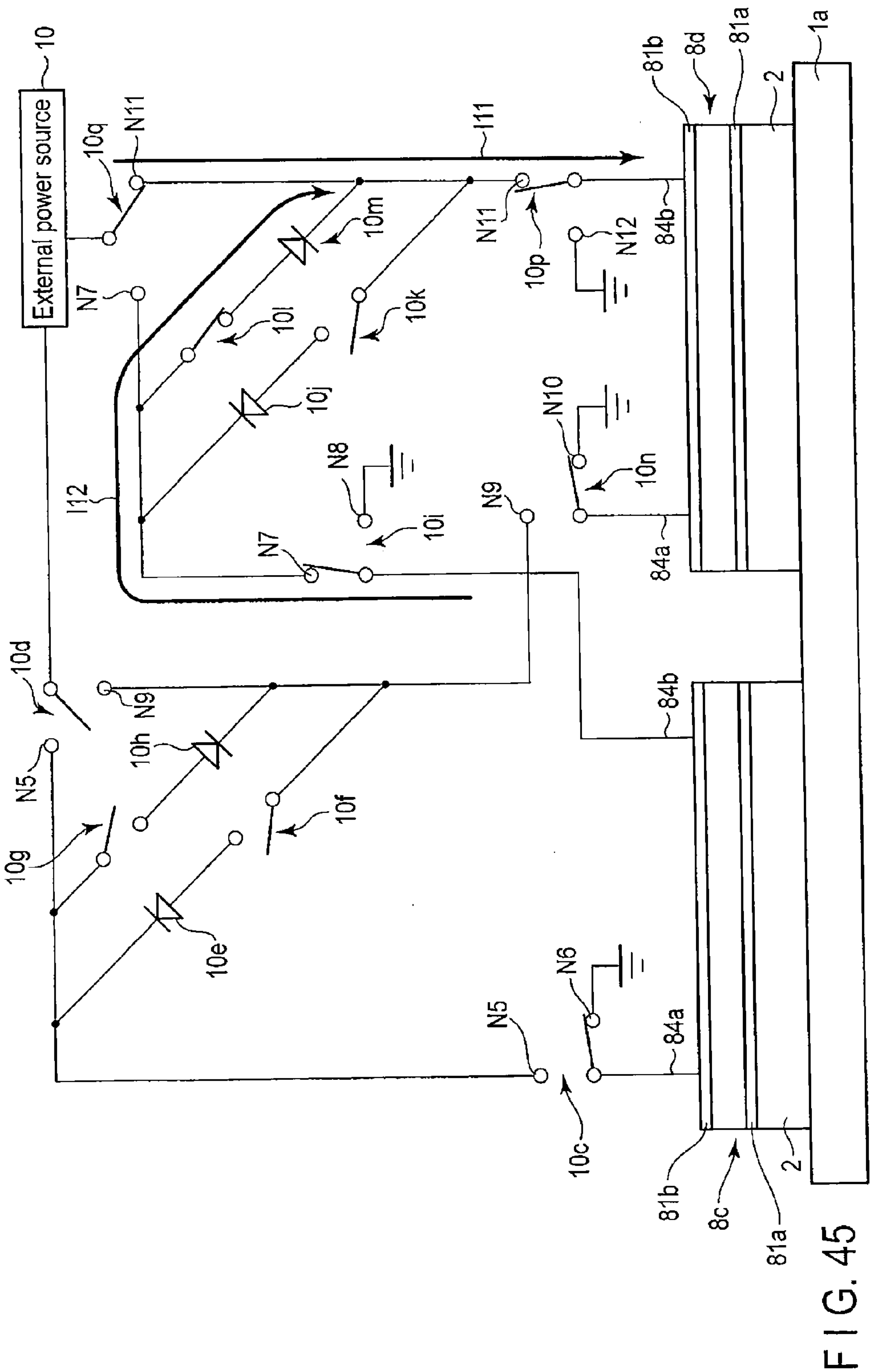
FIG. 45 illustrates an example of the operation of a circuit in a case where two adjacent Peltier elements are electrically connected to each other.

Referring to FIG. 45, also will be described the method where heat accumulated in the Peltier element 8*c* is reused in the Peltier element 8*d* as electric current. It is assumed that electric current is caused to flow in the Peltier element 8*d* from, for example, the lead wire 84*b*, so that the ceramic substrate 81*a* is dissipating heat and the ceramic substrate 81*b* is absorbing heat.

As shown in FIG. 45, when the switch 10*p* is connected to the node N11, the switch 10*q* is also connected to the node N11, and the switch 10*n* is connected to the node N10, current flows from the external power source 10, via the node N11 and lead wire 84*b*, to the Peltier element 8*d* (see the arrow I11 in FIG. 44). Also, when the switch 10*i* is connected to the node N7, the switch 10*l* is turned on, and the switch 10*c* is connected to the node N6, current flows from the lead wire 84*b* of the Peltier element 8*c*, via the node N7, rectifying element 10*m*, node N11, the lead wire 84*b* of the Peltier element 8*d*, to the Peltier element 8*d* (see the arrow I12 in FIG. 45) based on the temperature difference between the ceramic substrates 81*a* and 81*b* of the Peltier element 8*c*.

FIG. 46 is another example of a circuit for electrically connecting two Peltier elements adjacent to each other. As shown in FIG. 46, even where the Peltier elements 8 are arranged on the back of the substrate 1*a*, as shown in FIG. 46, the eighth embodiment can be carried out.

<Effects of Operating of Memory System According to the Eighth Embodiment>

According to the eighth embodiment, when power is supplied to the first lead wire 84*a* of the Peltier element 8*c* or when power is supplied to the first lead wire 84*a* of another Peltier element, 8*d*, the first lead wire 84*a* of the Peltier element 8*d* is electrically connected to the lead wire 84*a* of the Peltier element 8*c*. When power is supplied to the second lead wire 84*b* of the Peltier element 8*c* or when power is supplied to the second lead wire 84_b_ of another Peltier element, 8_d_, the second lead wire 84_b_ of the other Peltier element 8_d_ is electrically connected to the second lead wire 84_b_ of the Peltier element 8_c_.

By suitably connecting the lead wires of two or more Peltier elements in such a manner, power generated by a temperature difference resulting from the heat dissipation or absorption of one of the Peltier elements 8 is used as power by the other Peltier elements 8, thereby reducing power required to be supplied by, for example, the external power source 10. Accordingly, power reduction can be achieved in the memory system 1.

Modified Examples

The heat generation elements described in the fourth embodiments can be used as the heat generation elements described in the first to third embodiments. However, the heat generation elements in the fourth embodiment cannot absorb heat. Therefore, if the NAND memories 2 have to be cooled, a cooling method utilizing air for cooling is used.

Additionally, a method for using, as heat generation elements, the peripheral circuits for the NAND chips 2_c_, as described in the fifth embodiment, can also be applied in the first to third embodiments.

The temperature sensors described in the sixth embodiment can also be applied in the first to fifth embodiments.

Additionally, the method for controlling the temperature of each NAND chip or NAND package, as described in the seventh embodiment, can also be applied in the third to fifth embodiments.

Furthermore, the method where, between the Peltier elements as described in the eighth embodiment, the heat of the Peltier elements can be reused as electricity, may also be applied in the first to third, sixth, and seventh embodiments.

When the heat of the Peltier elements is reused as electric power (refer to the eighth embodiment), the electric power may be used as another electric power supply for the memory system.

In each of the embodiments described above, a description was given using an SSD as an example of the memory system. However, the present embodiment is not limited to the SSD, but these embodiments can be applied in any memory system that has a nonvolatile memory and a controller for controlling the nonvolatile memory.

Each NAND memory 2 uses the packaging method to seal the printed board 2_b_, chips 2_c_, and wires 2_d_ in the package 2_a_ made of resin. However, the present embodiment is not limited to this packaging method.

In each embodiment described above, with regard to temperature control using heat generation elements (including the Peltier elements), the period for which temperature control is exerted, or temperature, can be altered, as necessity requires.

As a charge accumulating layer for each memory cell transistor MT, a conductive material or a charge trap type insulating film may be used.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:

a nonvolatile semiconductor memory configured to store data;

a temperature measuring equipment which measures the temperature of the nonvolatile semiconductor memory;

a Peltier element which varies the temperature of the nonvolatile semiconductor memory; and a control circuit including:

a transmitter which transfers data, received from a host, to the nonvolatile semiconductor memory;

a temperature storage which stores temperature information from the temperature measuring equipment; and a temperature controller which controls the Peltier element based on the temperature information stored in the temperature storage, wherein the temperature controller decreases the temperature of the nonvolatile semiconductor memory by using the Peltier element when the temperature of the nonvolatile semiconductor memory is higher than a first predetermined temperature, before the temperature controller writes or erases data in the nonvolatile semiconductor memory, writes or erases data in the nonvolatile semiconductor memory when the temperature of the nonvolatile semiconductor memory is lower than the first predetermined temperature, and increases the temperature of the nonvolatile semiconductor memory by using the Peltier element when the temperature controller does not write or erase data and the temperature of the nonvolatile semiconductor memory is lower than a second predetermined temperature which is higher than the first predetermined temperature.

2. The memory system according to claim 1, wherein where power is supplied to one end of the Peltier element, or where power is supplied to one end of another Peltier element, the one end of the latter Peltier element is electrically connected to the one end of the former Peltier element, and wherein where power is supplied to the other end of the former Peltier element, or where power is supplied to the other end of latter Peltier element, the other end of the latter Peltier element is electrically connected to the other end of the former Peltier element.

3. A memory system comprising:

a nonvolatile semiconductor memory;

wherein the nonvolatile semiconductor memory is a memory cell array on which a plurality of nonvolatile memory cells are arrayed, and is formed on a same semiconductor chip together with a peripheral circuit including a temperature varying section, and wherein when the temperature of the nonvolatile semiconductor memory is to be increased, the peripheral circuit repeats input/output of data in the nonvolatile semiconductor memory.

4. The memory system according to claim 1, wherein the nonvolatile semiconductor memory is adjacent to a first side of the Peltier element, the Peltier element absorbs heat of the first side when a first end of the Peltier element is connected to a power supply and a second end of the Peltier element is connected to a ground, when the temperature controller decreases the temperature of the nonvolatile semiconductor memory, the temperature controller connects the first end of the Peltier element to the power supply and the second end of the Peltier element to the ground.

5. The memory system according to claim 1, wherein the nonvolatile semiconductor memory is adjacent to a first side of the Peltier element, the Peltier element dissipates heat of the first side when a first end of the Peltier element is connected to a ground and a second end of the Peltier element is connected to a power supply, when the temperature controller increases the temperature of the nonvolatile semiconductor memory, the temperature controller connects the first end of the Peltier element to the ground and the second end of the Peltier element to the power supply.

6. A memory system comprising:

a nonvolatile semiconductor memory configured to store data;

a temperature measuring equipment which measures the temperature of the nonvolatile semiconductor memory;

a Peltier element which varies the temperature of the nonvolatile semiconductor memory; and a control circuit including:

a transmitter which transfers data, received from a host, to the nonvolatile semiconductor memory;

a temperature storage which stores temperature information from the temperature measuring equipment; and a temperature controller which controls the Peltier element based on the temperature information stored in the temperature storage, wherein the temperature controller increases the temperature of the nonvolatile semiconductor memory by using the Peltier element when the temperature of the nonvolatile semiconductor memory is lower than a first predetermined temperature, when the temperature controller receives a write command to write data to the nonvolatile semiconductor memory or a delete command to delete data from the nonvolatile semiconductor memory, executes the write command or the delete command when the temperature of the nonvolatile semiconductor memory is higher than the first predetermined temperature, decreases the temperature of the nonvolatile semiconductor memory by using the Peltier element when the temperature controller does not receive a write command or a delete command and the temperature of the nonvolatile semiconductor memory is higher than a second predetermined temperature.

7. The memory system according to claim 6, wherein where power is supplied to a first end of the Peltier element, or where power is supplied to a first end of a second Peltier element, the first end of the second Peltier element is electrically connected to the first end of the Peltier element, and wherein where power is supplied to the second end of the Peltier element, or where power is supplied to the second end of the second Peltier element, the second end of the second Peltier element is electrically connected to the second end of the Peltier element.

8. The memory system according to claim 6, wherein the nonvolatile semiconductor memory is adjacent to a first side of the Peltier element, when the temperature controller decreases the temperature of the nonvolatile semiconductor memory, the temperature controller supplies power to a first end of the Peltier element, such that the first side absorbs heat.

9. The memory system according to claim 6, wherein the nonvolatile semiconductor memory is adjacent to a first side of the Peltier element, when the temperature controller increases the temperature of the nonvolatile semiconductor memory, the temperature controller supplies power to a second end of the Peltier element, such that the first side dissipates heat.

10. The memory system according to claim 3, wherein the nonvolatile semiconductor memory comprises a memory cell array and a data input/output buffer, the memory cell array includes a plurality of pages, each page includes a plurality of nonvolatile memory cells and is a unit of writing data, page data is written in the nonvolatile semiconductor memory via the data input/output buffer, the peripheral circuit executes a dummy writing operation which does not write the data to the memory cell array and writes data to the data input/output buffer.

11. The memory system according to claim 10, further comprising:

a host interface configured to connect with the host; and a temperature controller, wherein the temperature controller measures temperature of the nonvolatile semiconductor memory, when the host interface receives a write command from the host, and executes data input/output to the data input/output buffer, when the measured temperature has not reached a predetermined temperature.

12. The memory system according to claim 11, wherein the temperature controller measures the temperature of the nonvolatile semiconductor memory, if the temperature controller determines that the temperature of the nonvolatile semiconductor memory has reached the predetermined temperature, the temperature controller permits the issuing of the writing command.

13. The memory system according to claim 12, further comprising:

a transmitter which issues a write command to write data to the nonvolatile semiconductor memory.

14. The memory system according to claim 13, wherein the nonvolatile semiconductor memory is a NAND type flash memory.

* * * * *